(12) United States Patent
Nakano

(10) Patent No.: US 7,466,393 B2
(45) Date of Patent: Dec. 16, 2008

(54) IMMERSION EXPOSURE TECHNIQUE

(75) Inventor: Hitoshi Nakano, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/760,074

(22) Filed: Jun. 8, 2007

(65) Prior Publication Data

US 2007/0229783 A1    Oct. 4, 2007

Related U.S. Application Data

(62) Division of application No. 10/872,513, filed on Jun. 22, 2004, now Pat. No. 7,349,064.

(30) Foreign Application Priority Data

Jun. 27, 2003    (JP)    ............................. 2003-185389

(51) Int. Cl.
G03B 27/42    (2006.01)
G03B 27/58    (2006.01)
G03B 27/52    (2006.01)

(52) U.S. Cl. .............................. 355/53; 355/30; 355/72

(58) Field of Classification Search .................. 355/30, 355/53, 55, 72; 250/548; 430/327
See application file for complete search history.

(56) References Cited

U.S. PATENT DOCUMENTS

| | | | |
|---|---|---|---|
| 4,509,852 A | 4/1985 | Tabarelli et al. ................ | 355/30 |
| 5,332,977 A | 7/1994 | Fritsche et al. ............... | 330/297 |
| 5,550,633 A | 8/1996 | Kamiya ...................... | 356/358 |
| 5,610,683 A | 3/1997 | Takahashi ................... | 355/53 |
| 6,101,952 A | 8/2000 | Thornton et al. ............ | 104/282 |
| 6,665,046 B2 | 12/2003 | Nogawa et al. ............... | 355/30 |
| 6,734,950 B2 | 5/2004 | Nakano ....................... | 355/72 |
| 6,757,048 B2 | 6/2004 | Arakawa ..................... | 355/30 |
| 6,788,477 B2 | 9/2004 | Lin ............................. | 359/820 |
| 6,867,844 B2 | 3/2005 | Vogel et al. .................. | 355/30 |
| 6,952,253 B2 | 10/2005 | Lof et al. ...................... | 355/30 |
| 7,268,854 B2 | 9/2007 | Nagasaka ..................... | 355/53 |
| 2001/0028443 A1 | 10/2001 | Yabu ........................... | 355/30 |

(Continued)

FOREIGN PATENT DOCUMENTS

EP    1 571 698 A1    12/2003

(Continued)

OTHER PUBLICATIONS

U.S. Appl. No. 60/462,786, filed Apr. 11, 2003, Novak et al.

(Continued)

*Primary Examiner*—Peter B Kim
(74) *Attorney, Agent, or Firm*—Fitzpatrick, Cella, Harper & Scinto

(57) ABSTRACT

An exposure apparatus which exposes a substrate to a pattern of an original via a projection optical system, with a gap between the projection optical system and the substrate being filled with liquid. The apparatus includes an ejection member configured to eject a gas through an ejection port outside the liquid, and a suction member configured to suck the gas through a suction portion outside the liquid. The suction port is arranged to be more distant than the ejection port from a center of an optical axis on a final surface of the projection optical system.

15 Claims, 17 Drawing Sheets

U.S. PATENT DOCUMENTS

| | | | |
|---|---|---|---|
| 2002/0020821 A1 | 2/2002 | Van Santen et al. | 250/492.2 |
| 2002/0057425 A1 | 5/2002 | Nakano | 355/72 |
| 2002/0122162 A1 | 9/2002 | Nakauchi et al. | 355/52 |
| 2004/0075895 A1 | 4/2004 | Lin | 359/380 |
| 2004/0109237 A1 | 6/2004 | Epple et al. | 359/649 |
| 2004/0207824 A1 | 10/2004 | Lof et al. | 355/30 |
| 2004/0211920 A1 | 10/2004 | Derksen et al. | 250/492.1 |
| 2004/0257544 A1 | 12/2004 | Vogel et al. | 355/30 |
| 2005/0168713 A1 | 8/2005 | Vogel et al. | 355/30 |
| 2005/0237504 A1 | 10/2005 | Nagasaka et al. | 355/53 |
| 2005/0259234 A1 | 11/2005 | Hirukawa et al. | 355/53 |
| 2005/0280791 A1 | 12/2005 | Nagasaka et al. | 355/53 |
| 2006/0023183 A1 | 2/2006 | Novak et al. | 355/53 |
| 2006/0023186 A1 | 2/2006 | Binnard | 355/53 |
| 2006/0028632 A1 | 2/2006 | Hazelton et al. | 355/53 |
| 2006/0033894 A1 | 2/2006 | Binnard | 355/30 |
| 2006/0077367 A1 | 4/2006 | Kobayashi et al. | 355/53 |
| 2006/0098178 A1 | 5/2006 | Nagasaka et al. | 355/53 |
| 2006/0114445 A1 | 6/2006 | Ebihara | 355/72 |
| 2006/0132736 A1 | 6/2006 | Nagasaka et al. | 355/53 |
| 2006/0146306 A1 | 7/2006 | Nagasaka et al. | 355/53 |
| 2006/0274293 A1 | 12/2006 | Nagasaka et al. | 355/53 |
| 2006/0274294 A1 | 12/2006 | Nagasaka et al. | 355/53 |
| 2007/0035710 A1 | 2/2007 | Nagasaka et al. | 355/53 |
| 2007/0064210 A1 | 3/2007 | Kobayashi et al. | 355/53 |
| 2007/0132968 A1 | 6/2007 | Kobayashi et al. | 355/30 |

FOREIGN PATENT DOCUMENTS

| | | |
|---|---|---|
| JP | 63-20014 | 1/1988 |
| JP | 6-6248 | 1/1994 |
| JP | 6-124873 | 5/1994 |
| JP | 2001/527380 | 12/2001 |
| JP | 2004-207711 | 7/2004 |
| JP | 2005-012228 | 1/2005 |
| JP | 2005-109426 | 4/2005 |
| JP | 2005-277363 | 10/2005 |
| WO | WO 99/33691 | 7/1999 |
| WO | WO 99/49504 | 9/1999 |
| WO | WO 2004/090577 A2 | 10/2004 |
| WO | WO 2004/092830 A2 | 10/2004 |
| WO | WO 2004/114380 A1 | 12/2004 |
| WO | WO 2005/053955 A1 | 6/2005 |

OTHER PUBLICATIONS

U.S. Appl. No. 60/462,499, filed Apr. 11, 2003, Binnard.

Japanese Office Action dated Feb. 7, 2007, issued in corresponding Japanese patent application No. 2002/296302, with English translation.

Japanese Office Action dated Jul. 27, 2007, issued in corresponding Japanese patent application No. 2002-291806, with an English translation.

U.S. Appl. No. 60/462,112, filed Apr. 10, 2003, Hazelton et al.

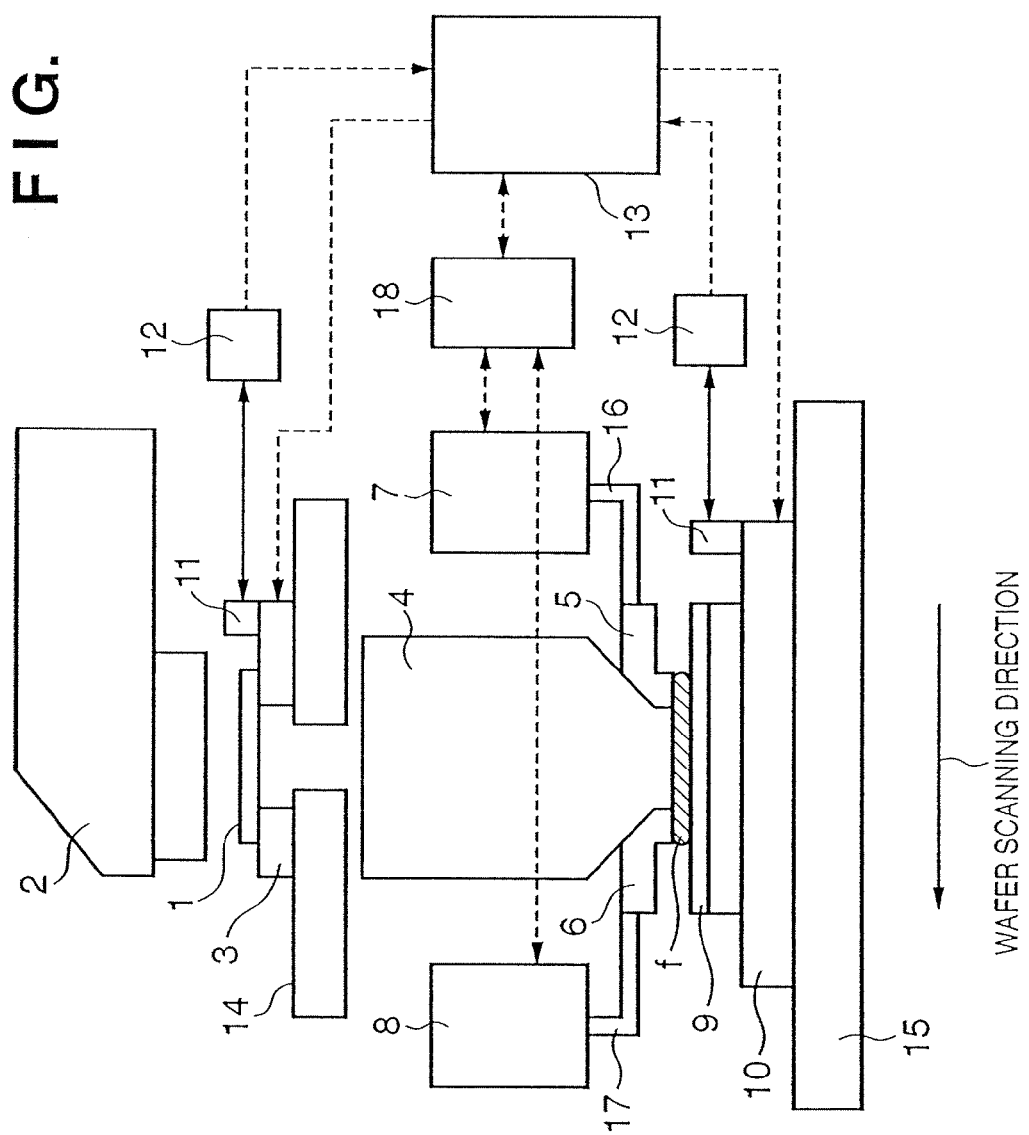

F I G. 10A
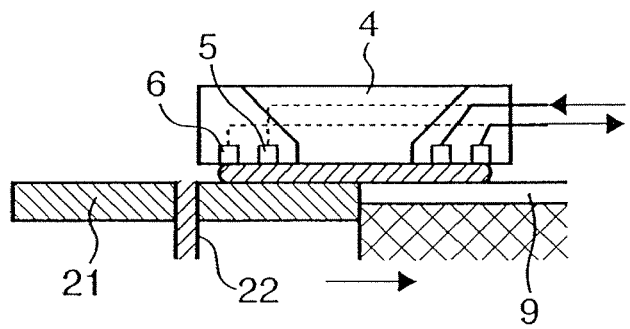
F I G. 10B
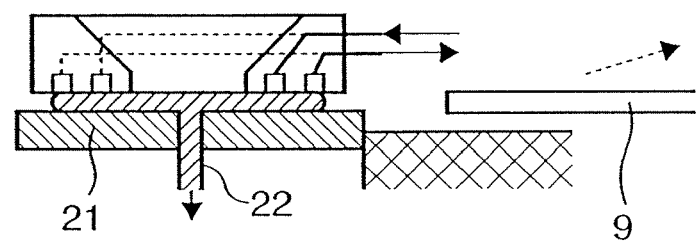
F I G. 10C
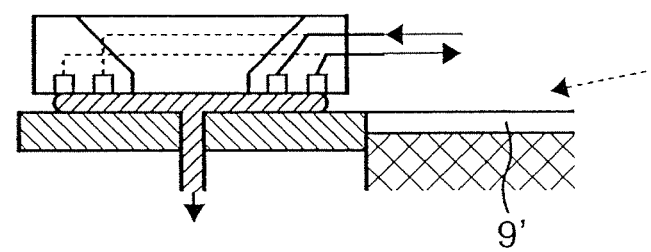
F I G. 10D
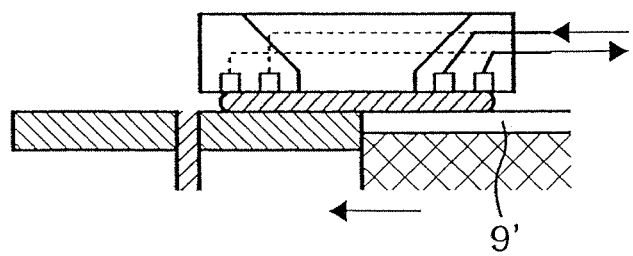

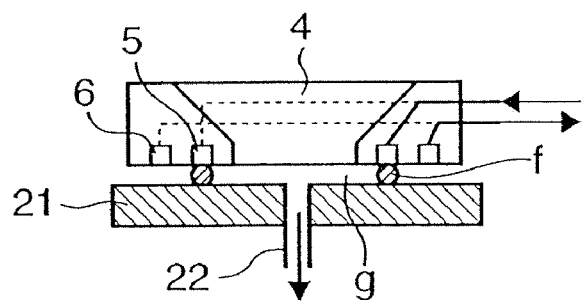
F I G. 11A
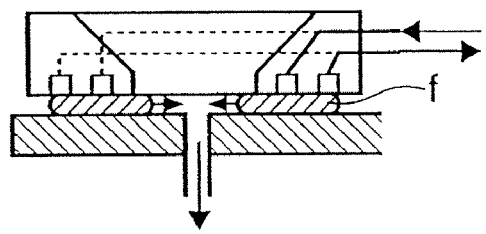
F I G. 11B
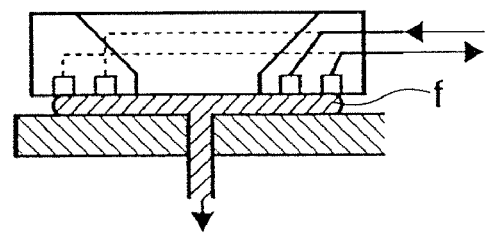
F I G. 11C
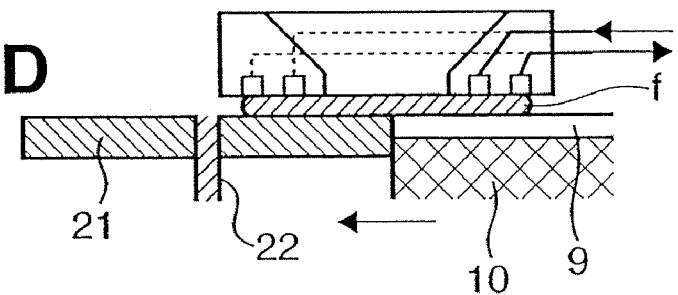
F I G. 11D

IMMERSION EXPOSURE TECHNIQUE

This application is a divisional application of copending U.S. patent application Ser. No. 10/872,513, filed on Jun. 22, 2004.

FIELD OF THE INVENTION

The present invention relates to an exposure technique for exposing a substrate coated with a photosensitive material to a pattern in manufacturing a device, such as a semiconductor device, a liquid crystal display device, or the like, and, more particularly, to an exposure technique using an immersion method.

BACKGROUND OF THE INVENTION

The manufacturing process of a semiconductor device with a submicroscopic pattern, such as an LSI, VLSI, or the like, employs a reduction projection exposure apparatus, which reduces and projects a pattern formed on a mask and transfers it onto a substrate coated with a photosensitive agent. Along with an increase in the integration degree of semiconductor devices, finer patterns have been demanded. Concurrently, with development of resist processes, measures have been taken against exposure apparatuses for miniaturizing patterns.

To improve the resolution of an exposure apparatus, a method of shortening the exposure wavelength or a method of increasing the numerical aperture (NA) of the projection optical system is generally employed.

As for the exposure wavelength, a KrF excimer laser with an oscillation wavelength of 365-nm i-line to recently around 248 nm, and an ArF excimer laser with an oscillation wavelength around 193 nm have been developed. A fluorine ($F_2$) excimer laser with an oscillation wavelength around 157 nm is also under development.

As another technique for increasing the resolution, a projection exposure method using immersion is receiving attention. Conventionally, the space between the final surface of a projection optical system and a substrate (e.g., a wafer) to be exposed is filled with a gas. Immersion performs projection exposure by filling this space with a liquid. For example, assume that pure water (whose refractive index is 1.33) is to be provided to the space between a projection optical system and a wafer, and the maximum incident angle of light beams which form an image on the wafer in immersion is equal to that in a conventional method. In this case, the resolution in immersion becomes 1.33 times higher than that in the conventional method, even when a light source having the same wavelength is used in each method. This is equivalent to an increase in NA of the projection optical system in the conventional method by a factor of 1.33. Immersion makes it possible to obtain a resolution whose NA is 1 or more, which cannot be attained by the conventional method.

To fill the space between the final surface of a projection optical system and a wafer surface, mainly, two types of methods have been proposed.

One of them is a method of placing the final surface of the projection optical system and the entire wafer in a liquid tank. Japanese Patent Laid-Open No. 6-124873 discloses an exposure apparatus using this method.

The other is a method of supplying a liquid only to the space between the projection optical system and the wafer surface, i.e., a local fill method. Publication WO99/49504 discloses an exposure apparatus using this method.

In the method disclosed in Japanese Patent Laid-Open No. 6-124873, a liquid may splash about when a wafer moves at high velocity, and equipment is required to recover such splashes. Also, micro-bubbles caused by the wavy liquid surface my adversely affect the imaging performance. In addition, this method may increase the complexity and size of the apparatus.

In the method disclosed in WO99/49504, assume that the gap between a wafer and a projection optical system is small. In this case, even when a nozzle is directed toward the gap, and a liquid is supplied to the gap, the liquid discharged from the nozzle does not flow into the gap, and a gas remains in the gap. For this reason, satisfactory immersion cannot be performed. A liquid having failed to flow into the gap collides with the perimeter of a projection lens and escapes externally. Equipment for recovering the liquid needs to be provided around the perimeter, and the size of the exposure apparatus increases. Even if a liquid can be supplied into the small gap, since the flow resistance inside the gap is larger than that outside the gap, the flow velocity of the liquid discharged from the nozzle is much higher than that in the gap. For this reason, the flow velocity changes excessively at the tip of the nozzle or at a portion where the liquid collides with the perimeter of the projection lens, the flow is greatly disturbed, and air bubbles may be generated. These air bubbles may enter the gap between the projection lens and the wafer, may prevent transmission of light, and may adversely affect the imaging performance of the exposure apparatus.

In the method disclosed in WO99/49504, a liquid supplied onto the wafer needs to be recovered at least for every wafer replacement, and the productivity of the apparatus must be sacrificed to recover the liquid. Recovery of a liquid on the wafer means recovering a liquid below the projection lens. For this reason, a part of the lower surface of the projection lens can get wet at every wafer replacement, another part can be coated with a thin liquid film, and still another part can directly be exposed to the outer air. The environment surrounding the projection lens and wafer contains impurities in larger amounts in comparison with the supplied liquid, and a liquid staying on the lower surface of the projection lens may absorb an impurity contained in the outer air. The liquid staying on the lower surface of the projection lens evaporates to the outer air, and the impurity originally contained in the liquid or an impurity absorbed from the outer air condenses in the liquid. As a result, an impurity may be attached to the surface of the projection lens to cause clouds or the impurity may remain as a residue after the evaporation/drying of the liquid on the surface of the projection lens to cause clouds.

SUMMARY OF THE INVENTION

The present invention has been made in consideration of the above-mentioned problems, and has as its object to increase the practicality of an exposure technique using an immersion method and, for example, more reliably fill the gap between the final surface of a projection optical system and a substrate with a liquid, suppress contamination on the final surface of the projection optical system, simplify the structure of an exposure apparatus, reduce the size of the exposure apparatus, or the like.

According to the first aspect of the present invention, there is provided an exposure apparatus which exposes a substrate to a pattern through a projection optical system, the apparatus comprising a substrate stage which holds and moves the substrate and a supply unit, which has a supply nozzle and supplies a liquid to a surface of the substrate, an opening of the supply nozzle being arranged at a side of the projection optical system so as to oppose the substrate, and the supply unit supplying the liquid in accordance with movement of the substrate by the substrate stage.

According to the second aspect of the present invention, there is provided an exposure apparatus which exposes a substrate to a pattern through a projection optical system, the apparatus comprising a substrate stage, which holds and moves the substrate, a movable flat plate, a supply unit, which supplies a liquid to at least one of a portion between a final surface of the projection optical system and the substrate and a portion between the final surface and the flat plate, and a recovery unit which recovers the liquid from at least one of a portion between the final surface and the substrate and a portion between the final surface and the flat plate.

According to the third aspect of the present invention, there is provided an exposure apparatus, which exposes a substrate to a pattern through a projection optical system, the apparatus comprising a substrate stage, which holds and moves the substrate, an opposing member, which extends from an end portion of a final surface of the projection optical system and has a surface opposing the substrate, and a supply unit, which supplies a liquid to a surface of the substrate through an outlet port formed in the opposing surface.

According to the fourth aspect of the present invention, there is provided an exposure apparatus which exposes a substrate to a pattern through a projection optical system, the apparatus comprising a substrate stage, which holds and moves the substrate, a supply unit, which supplies a liquid to a space between a final surface of the projection optical system and the substrate through a supply port, and an ejecting portion, which ejects a gas toward the substrate through an ejecting port formed outside the supply port with respect to the final surface.

According to the fifth aspect of the present invention, there is provided an exposure method of exposing a substrate to a pattern through a projection optical system, the method comprising steps of moving the substrate by a substrate stage, and supplying a liquid to a surface of the substrate through a supply nozzle, an opening of the supply nozzle being arranged at a side of the projection optical system so as to oppose the substrate, and in the supply step, the liquid being supplied in accordance with movement of the substrate by a substrate stage.

According to the sixth aspect of the present invention, there is provided an exposure method of exposing a substrate to a pattern through a projection optical system, the method comprising steps of moving the substrate by a substrate stage, moving a movable flat plate, supplying a liquid to at least one of a portion between a final surface of the projection optical system and the substrate and a portion between the final surface and the flat plate, and recovering the liquid from at least one of a portion between the final surface and the substrate and a portion between the final surface and the flat plate.

According to the seventh aspect of the present invention, there is provided a device manufacturing method comprising a step of exposing a substrate to a pattern using any one of the above exposure apparatuses of the present invention.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 is a view schematically showing the arrangement of a preferred embodiment of the present invention;

FIGS. 10A to 10D are sectional views showing another step of feeding the flat plate below the projection system in the exposure apparatus according to the embodiment shown in FIG. 8;

FIGS. 11A to 11D are sectional views showing a step of generating a liquid film below the projection optical system in the exposure apparatus according to the embodiment shown in FIG. 8;

DETAILED DESCRIPTION OF THE PREFERRED EMBODIMENTS

Figure 2A:
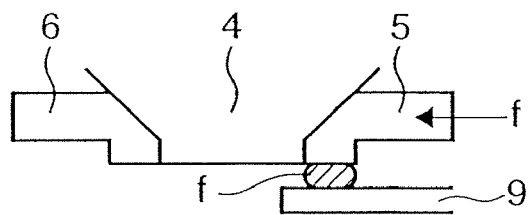
FIGS. 2A to 2G are sectional views schematically showing steps of filling with a liquid the gap between a projection optical system and a wafer.

An exposure apparatus according to the present invention is useful to, e.g., all exposure methods and exposure apparatuses that use ultraviolet light as exposure light and use immersion in which the gap between a projection optical system and a substrate (e.g., a wafer) is filled with a liquid. These exposure apparatuses can include, e.g., one which projects and transfers a pattern on a master onto a substrate while the substrate is in a stationary state and one which performs scanning exposure for a substrate to a pattern on a master using slit light while synchronously scanning the substrate and master.

A preferred embodiment of the present invention will be illustrated below. FIG. 1 is a view schematically showing the arrangement of the preferred embodiment of the present invention. In FIG. 1, light emitted from an exposure light source (not shown) such as an ArF excimer laser or $F_2$ laser is supplied to an illumination optical system 2. The illumination optical system 2 uses the light supplied from the exposure light source to illuminate part of a reticle (master) 1 with slit light (light having a sectional shape as if it passed through a slit). While illuminating the reticle 1 with the slit light, a reticle stage (master stage) 3 holding the reticle and a wafer stage (substrate stage) 10 holding a wafer (substrate) 9 perform scanning movement in synchronism with each other. Through this synchronous scanning, an image of the entire pattern on the reticle 1 is continuously formed on the wafer 9 through a projection optical system 4 to expose to light a resist applied to the surface of the wafer 9.

The two-dimensional positions of the reticle stage 3 and wafer stage 10 are measured in real time by a reference mirror 11 and distance measurement laser interferometer 12, respectively. A stage control apparatus 13 performs alignment and synchronous control for the reticle 1 (reticle stage 3) and wafer 9 (wafer stage 10) on the basis of the measurement values from the reference mirror 11 and distance measurement laser interferometer 12. The wafer stage 10 incorporates a driving unit which adjusts, changes, or controls the vertical position, rotational direction, and tilt of the wafer 9. In exposure, the driving unit controls the wafer stage 10 such that an exposure region on the wafer 9 precisely coincides with the focal plane of the projection optical system 4. The position (vertical position and tilt) of the upper surface of the wafer 9 is measured by an optical focus sensor (not shown) and is supplied to the stage control apparatus 13.

An exposure apparatus main body is placed in an environment chamber (not shown), and the environment of the exposure apparatus main body is kept at a predetermined temperature. Temperature-controlled air for air conditioning is separately supplied to a space surrounding the reticle stage 3, wafer stage 10, and distance measurement laser interferometer 12, and a space surrounding the projection optical system 4, thereby maintaining the ambient temperature at higher precision.

In this embodiment, immersion in which the space or gap between the projection optical system 4 and the wafer 9 is filled with a liquid is implemented by a liquid supply nozzle 5 arranged above the wafer 9 and in the vicinity of the projection optical system 4 and a liquid recovery nozzle 6 opposing the liquid supply nozzle 5 through the projection optical system 4.

Immersion to be performed in this embodiment will be described below in detail. The liquid supply nozzle 5 is arranged upstream in a direction in which the wafer 9 is scanned during exposure and in the vicinity of the projection optical system 4. For example, if the wafer is to be moved from right to left, i.e., leftward (second direction), the upstream of the scanning direction is on the right (first direction). More specifically, if the scanning direction (second direction) is indicated by an arrow, the side of the starting point of the arrow (first direction) is the upstream. The liquid recovery nozzle 6 opposes the liquid supply nozzle 5 (i.e., downstream in the scanning direction) through the projection optical system 4.

The liquid supply nozzle 5 is connected to a liquid supply unit 7 through a supply pipe 16. Similarly, the liquid recovery nozzle 6 is connected to a liquid recovery unit 8 through a recovery pipe 17. The liquid supply unit 7 can include a tank, which stores a liquid, a pressure feed unit, which feeds the liquid, and a flow controller, which controls the supply flow rate of the liquid. The liquid supply unit 7 preferably further includes a temperature controller for controlling the supply temperature of the liquid. The liquid recovery unit 8 can include, e.g., a tank, which temporarily stores a recovered liquid, a suction unit, which sucks the liquid, and a flow controller for controlling the recovery flow rate of the liquid. An immersion controller 18 receives information such as the current position, velocity, acceleration, target position, and moving direction of the wafer stage 10 from the stage control apparatus 13 and gives instructions to start or stop immersion, control the flow rate, and the like, to the liquid supply unit 7 and liquid recovery unit 8, on the basis of this information.

As an immersion liquid, one which absorbs little exposure light is selected. The immersion liquid desirably has a refractive index almost equal to that of a dioptric element made of, e.g., quartz or fluorite. More specifically, examples of the immersion liquid include pure water, functional water, a fluorinated solution (e.g., fluorocarbon), and the like. A dissolved gas is preferably well removed from the immersion liquid using a degasifier. This aims at suppressing generation of air bubbles and immediately absorbing any generated air bubbles in the liquid. For example, if nitrogen and oxygen, which are contained in a large quantity in the environmental gas, are removed from the liquid by 80% or more of the maximum permissible gas content of the liquid, generation of air bubbles can sufficiently be suppressed. The exposure apparatus may be provided with a degasifier (not shown) and may supply a liquid to the liquid supply unit 7 while removing a gas dissolved in the liquid. As the degasifier, e.g., a vacuum degasifier is preferably used. This vacuum degasifier supplies a liquid to one side of a gas-permeable film, evacuates the other side to a vacuum, and traps a gas dissolved in the liquid into the vacuum through the film.

A step of filling a liquid between the projection optical system 4 and the wafer 9 will be described with reference to FIGS. 2A to 2G.

While the wafer 9 is in a stationary state or is moving, the liquid supply nozzle 5 supplies a liquid f onto the water 9 at, e.g., a constant flow rate to bring the liquid into intimate contact with the lower surface of the liquid supply nozzle 5 and the upper surface of the wafer 9. With this operation, a satisfactory liquid film is formed (FIG. 2A).

Figure 2B:
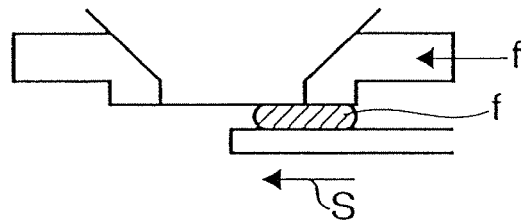
Figure 2C:
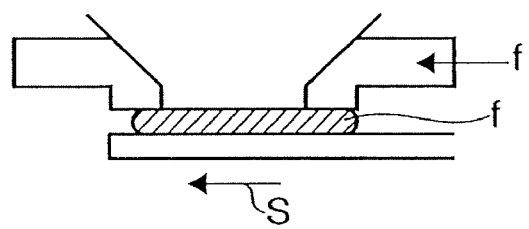

The wafer 9 starts moving or further moves while continuously supplying the liquid from the liquid supply nozzle 5. The movement of the wafer is used to guide the liquid film below the projection optical system 4 without breaking the liquid film (formed in FIG. 2A) (FIGS. 2B and 2C).

Figure 2D:
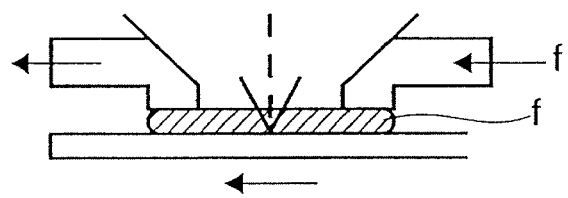

When the wafer 9 further moves to reach an exposure start position, scanning exposure using slit light starts (FIG. 2D). During the slit exposure, the liquid supply nozzle 5 continuously supplies the liquid, as described with reference to FIG. 2C, and the liquid recovery nozzle 6 starts recovering the liquid flowing from the downstream side (on the left in FIGS. 2A to 2G) of a scanning direction S with respect to the projection optical system 4. With this operation, a space between the wafer 9 and the projection optical system 4 is stably filled with the liquid (FIG. 2D).

Figure 2E:
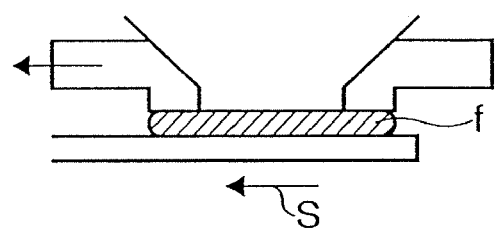
Figure 2F:
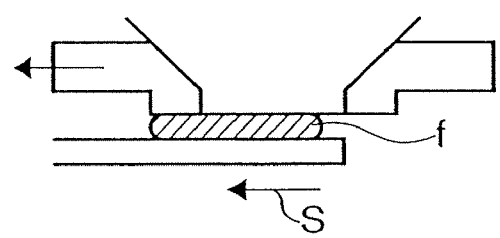
Figure 2G:
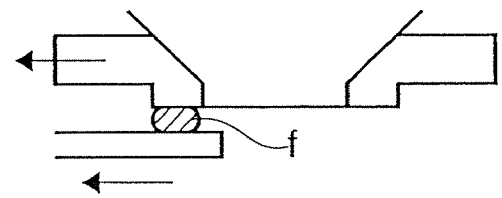

When the wafer 9 further moves to reach an exposure end position, the exposure using the slit light ends (FIG. 2E). Upon completion of the exposure using the slit light, the liquid supply nozzle 5 stops supplying the liquid (FIG. 2E). The liquid recovery nozzle 6 recovers the liquid left on the wafer 9 while moving the wafer 9 in the scanning direction S (FIGS. 2F and 2G).

If the liquid is continuously supplied onto the surface of the wafer 9 while moving the wafer 9 such that a liquid film expands along with the movement of the wafer 9, as described above, the gap between the final surface of the projection optical system 4 and the wafer can be filled with a continuous liquid film. This method can more reliably form a liquid film in the gap between the projection optical system 4 and the wafer 9 even when the gap is small and can more greatly reduce air bubbles in the liquid film, than a method disclosed in WO99/49504 of directing a nozzle toward the gap between the projection optical system 4 and the wafer 9 and supplying a liquid toward the gap. Also, according to this method, the liquid film moves at a lower velocity than the wafer and, thus, can reliably be recovered through the liquid recovery nozzle 6. Thus, outward splashes of the liquid can effectively be prevented.

A sequence for supplying and recovering a liquid, as described above, may be performed for each exposure shot region (each transfer of a reticle image). Alternatively, the sequence may be performed for all or some of the exposure shot regions on the wafer. In the latter case, supply and recovery of a liquid may be or may not be performed during stepping of the wafer between the exposure shot regions.

The above-mentioned immersion can be applied to an exposure apparatus which exposes a wafer while the wafer is in a stationary state (e.g., a so-called stepper). In this case, when, e.g., the wafer is stepped between the exposure shot regions, supply and recovery of a liquid is preferably controlled so as to expand a liquid film between an exposure shot region to be exposed next and the lower surface of the projection optical system 4.

Preferred examples of the detailed structures and layout of the liquid supply nozzle 5 and liquid recovery nozzle 6 will be described with reference to FIGS. 3 to 7.

Figure 3:
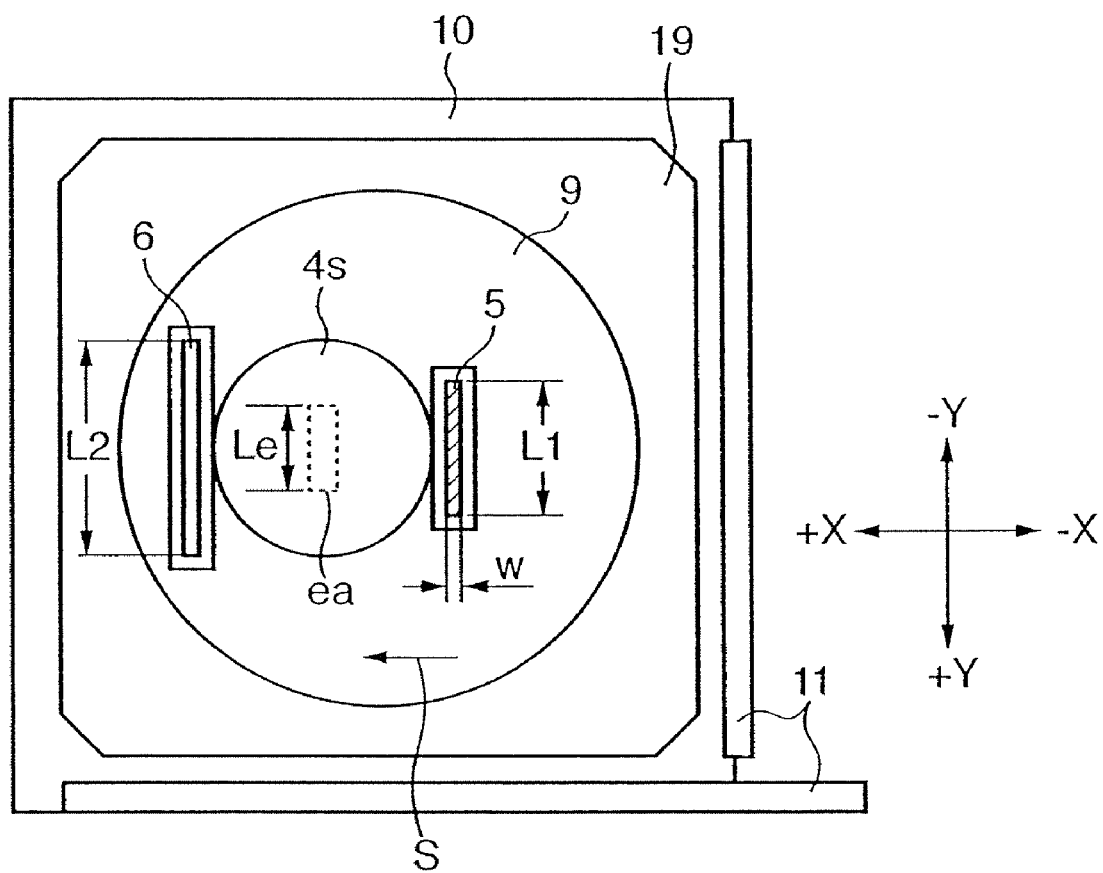
FIG. 3 is a view showing the first arrangement example of a liquid supply nozzle and liquid recovery nozzle in an exposure apparatus according to the preferred embodiment of the present invention.

FIG. 3 is a plan view as seen from above, obtained by cutting the exposure apparatus in FIG. 1 above the wafer 9. The liquid supply nozzle 5 is arranged upstream (in the −X direction as seen from the projection optical system 4), in a moving direction S (in the +X direction as seen from the projection optical system 4) of the wafer 9, of a final surface 4s of the projection optical system 4 while the liquid recovery nozzle 6 is arranged downstream (in the +X direction as seen from the projection optical system 4). When the exposure apparatus is a scanner (scanning exposure apparatus), the moving direction of the wafer 9 is desirably the same as that of the scanning direction of the wafer in exposure in order to stably form a liquid film.

The liquid supply nozzle 5 is preferably arranged such that its lower surface (lower end) is flush with or higher than the final surface (lower surface 4s) of the projection optical system 4. With this arrangement, a liquid can move together with the wafer in intimate contact with the final surface of the projection optical system 4 while eliminating an air layer. This prevents inclusion of air bubbles in a liquid film.

The liquid recovery nozzle 6 is preferably arranged such that its lower surface (lower end) is flush with or higher than the final surface (lower surface) 4s of the projection optical system 4. With this arrangement, a liquid on the wafer can efficiently be recovered while preventing a failure to recover the liquid (incomplete recovery).

A total length L1 of an outlet port through which the liquid supply nozzle 5 discharges a liquid is preferably equal to or larger than a length Le of a region through which exposure light beams pass and is more preferably equal to or larger than the width of the final surface 4s of the projection optical system 4. A length L2 of the liquid recovery nozzle 6 is preferably equal to or larger than the length L1 of the liquid discharge port of the liquid supply nozzle 5 and is more preferably equal to or larger than the width of the final surface 4s.

A flow rate V of a liquid to be supplied from the liquid supply nozzle 5 to a space (immersion space) between the wafer 9 and the lower surface of the projection optical system 4 is desirably determined in accordance with equation (1):

$$V \geq L1 \cdot d \cdot v \quad (1)$$

where d is a thickness of the space between the wafer and the final surface (lower surface) of the projection optical system 4, and v is a moving velocity of the wafer in immersion and is a scanning velocity of the wafer in scanning exposure.

Letting μ be a mean velocity of a liquid, to be supplied from the liquid supply nozzle 5 to the immersion space, at the liquid discharge port of the liquid supply nozzle 5, the flow rate V of the liquid is given by equation (2):

$$V = L1 \cdot w \cdot \mu \quad (2)$$

where w is a width of the liquid discharge port. Equation (3) is derived from equations (1) and (2):

$$\mu \geq d \cdot v / w \quad (3)$$

More generally, the flow rate of the liquid to be supplied is preferably determined such that the mean velocity at the liquid discharge port of the liquid supply nozzle 5 (i.e., the supply flow rate per unit area of the discharge port) is equal to or larger than the quotient obtained by dividing, by the width w of the discharge port, the product of the thickness d of the gap between the final surface 4s and the wafer 9 and the moving velocity v of the wafer stage 10. In the strict definition, w is the minimum of the width of the liquid discharge port along the moving direction of the wafer 9 in the corresponding liquid supply nozzle 5.

To start exposure from an end portion of the wafer, a liquid film needs to be sufficiently grown below the final surface (lower surface) 4s of the projection optical system 4 before the end portion of the wafer reaches an exposure region (region to be irradiated with exposure light). In the arrangement example shown in FIG. 3, a flush plate (flat plate) 19 almost flush with the wafer 9 is provided outside the wafer 9. This makes it possible to form a liquid film outside the wafer 9.

Figure 4:
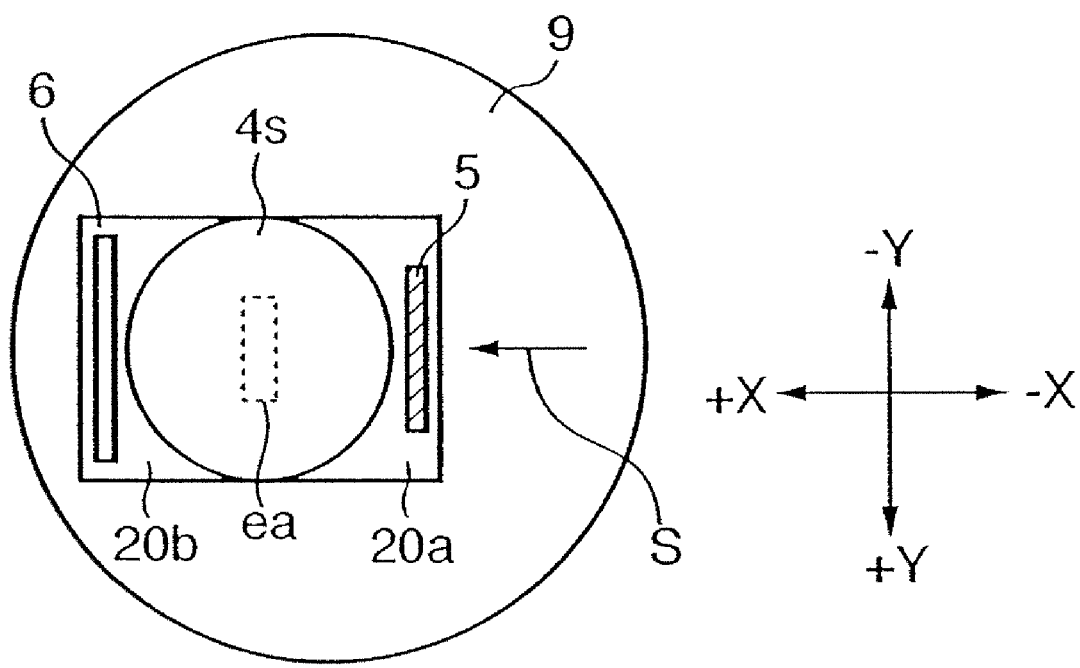
FIG. 4 is a view showing the second arrangement example of the liquid supply nozzle and liquid recovery nozzle in the exposure apparatus according to the preferred embodiment of the present invention.

FIG. 4 is a view showing the second arrangement example of the structures and layout of the liquid supply nozzle 5 and liquid recovery nozzle 6. The second arrangement example shown in FIG. 4 is different from the first arrangement example shown in FIG. 3 in that the ports of the liquid supply nozzle 5 and liquid recovery nozzle 6 are arranged within the surfaces (opposing surface opposing the wafer stage or wafer) of contiguous members 20a and 20b.

The bottom surfaces (opposing surfaces) of the contiguous members 20a and 20b are almost flush with the final surface 4s. The edge of the final surface 4s is so arranged as to come into intimate contact with the outer surface of the lens barrel of the projection optical system 4. With this arrangement, an interval between the wafer 9 and the bottom surface of the liquid supply nozzle 5, that between the wafer 9 and the bottom surface of the liquid recovery nozzle 6, and that between the wafer 9 and the final surface 4s can be made almost equal to each other, and the bottom surface of the liquid supply nozzle 5, the final surface 4$s$, and the bottom surface of the liquid recovery nozzle 6, can constitute contiguous surfaces.

This arrangement, in which the liquid supply nozzle 5 and liquid recovery nozzle 6 are arranged within planes contiguous to the final surface 4$s$, has the following advantage. More specifically, a liquid supplied from the liquid supply nozzle 5 comes into intimate contact with the wafer 9 and the bottom surface of the contiguous member 20$a$, in which the liquid supply nozzle 5 is formed, to form a liquid film. This liquid film, together with the wafer 9, moves toward the final surface 4$s$, which is contiguous to the bottom surface of the contiguous member 20$a$. The liquid film can smoothly advance to the final surface 4$s$ of the projection optical system 4 and then to the bottom surface of the contiguous member 20$b$. In this manner, the final surface 4$s$ and the members 20$a$ and 20$b$ contiguous to the final surface 4$s$ make it possible to fill the entire gap between them and the wafer 9 with a liquid.

Since a liquid film always moves together with the wafer 9 while its upper and lower surfaces are in intimate contact with planes, contact of the liquid film with the environment (gas) is substantially limited to the side surfaces of the liquid film, and thus, the contact area of the liquid film with the gas is small. The liquid film flows through almost a constant gap and hardly changes in velocity. For this reason, the flow of the liquid film hardly disorders, and air bubbles are unlikely to be generated in the liquid film. Also, this reduces dissolution of a gas in a liquid and can suppress generation of micro-bubbles in the liquid film due to a change in temperature or a local change in pressure.

The contiguous members 20$a$ and 20$b$ may be like a thin plate or block, or may have any other shape as far as their bottom surfaces are contiguous to the final surface (lower surface) 4$s$ of the projection optical system 4. The contiguous members 20$a$ and 20$b$ may be formed as portions integrated into the bottom surfaces of the nozzles 5 and 6 and/or the bottom surface of the lens barrel of the projection optical system 4.

Figure 5:
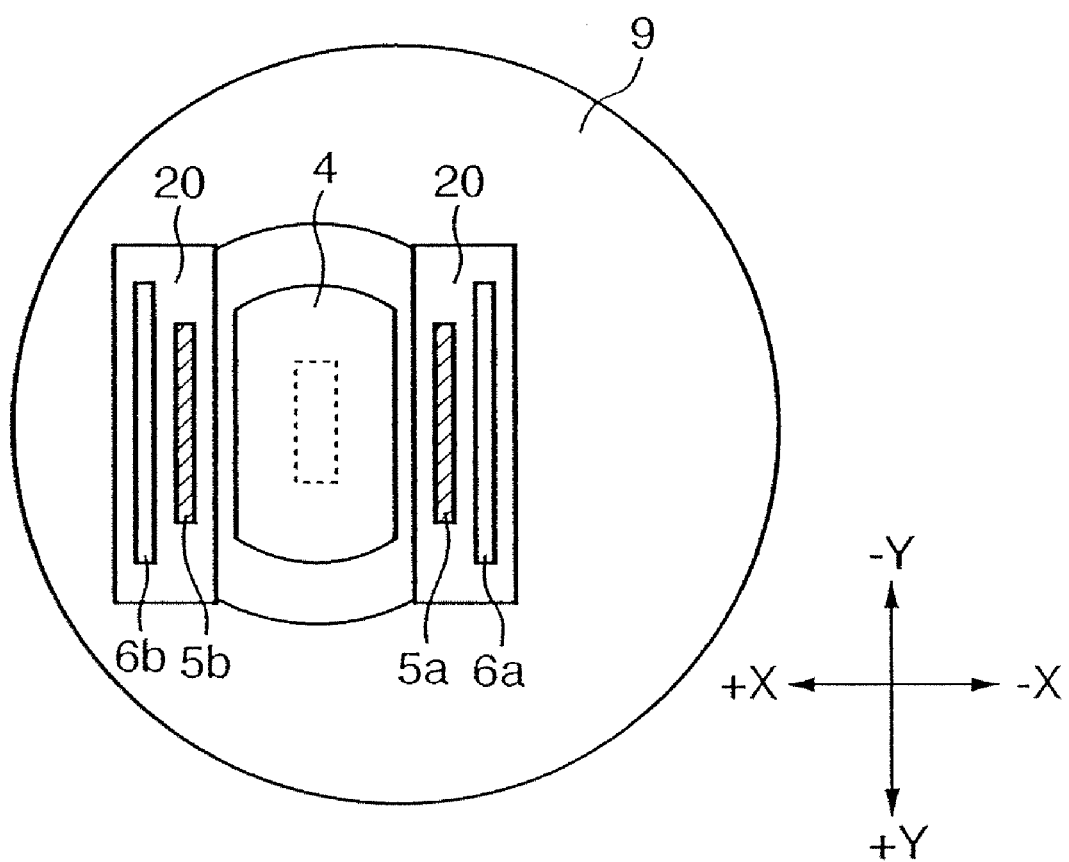
FIG. 5 is a view showing the third arrangement example of the liquid supply nozzle and liquid recovery nozzle in the exposure apparatus according to the preferred embodiment of the present invention.

FIG. 5 is a view showing the third arrangement example of the structures and layout of the liquid supply nozzle 5 and liquid recovery nozzle 6. The third arrangement example shown in FIG. 5 is different from the second arrangement example shown in FIG. 4 in that the liquid supply nozzles 5 (5$a$ and 5$b$) are arranged on both sides, respectively, of the final surface 4$s$, and the liquid recovery nozzles 6 (6$a$ and 6$b$) are arranged on both sides, respectively, of the final surface 4$s$.

The liquid supply nozzles 5$a$ and 5$b$ are arranged relatively nearer to the final surface 4$s$ of the projection optical system 4 so as to sandwich the projection optical system 4. On the other hand, the liquid recovery nozzles 6$a$ and 6$b$ are arranged relatively farther from the final surface 4$s$ of the projection optical system 4, i.e., outside the liquid supply nozzles 5$a$ and 5$b$.

While the wafer 9 moves in the +X direction indicated by an arrow shown in FIG. 5, the liquid supply nozzle 5$a$ supplies a liquid to the gap between the wafer 9 and the final surface 4$s$, and the liquid supply nozzle 5$b$ does not supply the liquid. At this time, the liquid recovery nozzle 6$b$ can recover most of the liquid. However, the liquid may flow in a direction opposite to the liquid recovery nozzle 6$b$, depending on the flow rate of the liquid to be supplied from the liquid supply nozzle 5$a$. Under the circumstances, in addition to the liquid recovery nozzle 6$b$, the liquid recovery nozzle 6$a$ is operated to recover the liquid flowing in the opposite direction. This can prevent splashes or spills of the liquid. In consideration of this effect, preferably, liquid recovery nozzles are arranged so as to surround the perimeter of the final surface 4$s$ and are operated in supplying a liquid from the liquid supply nozzles.

While the wafer 9 moves in the −X direction indicated by an arrow shown in FIG. 5, the liquid supply nozzle 5$b$ supplies a liquid, and the liquid supply nozzle 5$a$ does not supply the liquid, contrary to the above-mentioned case. In this manner, the gap between the wafer 9 and the final surface 4$s$ can always be filled with the liquid, regardless of the moving direction of the wafer. By switching the supply of the liquid between both the nozzles 5$a$ and 5$b$, even when the moving direction of the wafer is reversed, the gap between the wafer 9 and the final surface 4$s$ can be filled with the liquid without breaking the liquid film (without dividing the liquid film).

The shape of the final surface 4$s$ need not be circular. For example, if the final surface 4$s$ is oval, and portions facing the nozzles are linear, as shown in FIG. 5, the liquid supply nozzles 5$a$ and 5$b$ and liquid recovery nozzles 6$a$ and 6$b$ can be brought near to the optical path of exposure light beams. This can reduce the time required to fill the gap with the liquid and the moving distance of the wafer. In the case of a scanner, exposure light beams are slit-shaped on the surface of the wafer, and light beams, each having a sectional shape, which is short in the scanning direction and is long in a direction perpendicular to the scanning direction, are used in the final surface 4$s$, which is close to the wafer surface. The final surface of the projection optical system 4 can be formed into a shape, which is short in the scanning direction, such as an oval, in accordance with the section shape of the light beams. The shape of the final surface of the projection optical system is not limited to an oval, and the final surface can have various shapes, such as a rectangle, an arc, and the like.

Figure 6:
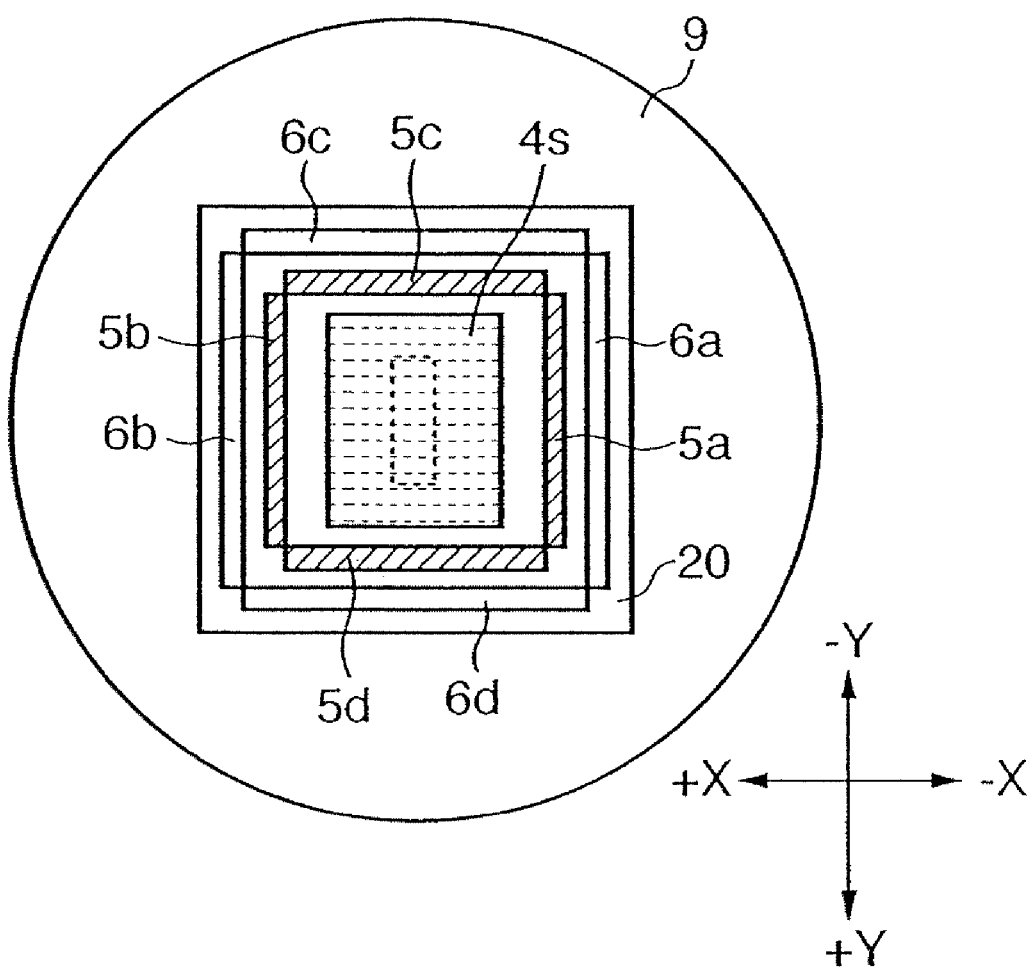
FIG. 6 is a view showing the fourth arrangement example of the liquid supply nozzle and liquid recovery nozzle in the exposure apparatus according to the preferred embodiment of the present invention.

FIG. 6 is a view showing the fourth arrangement example of the structures and layout of the liquid supply and liquid recovery nozzles. In the fourth arrangement example shown in FIG. 6, liquid supply nozzles 5$a$ to 5$d$ are provided on all sides surrounding the final surface 4$s$, and liquid recovery nozzles 6$a$ to 6$d$ are further provided so as to surround the liquid supply nozzles 5$a$ to 5$d$. When the wafer moves in the +X direction indicated by an arrow shown in FIG. 6, the liquid supply nozzle 5$a$ arranged upstream in the moving direction of the wafer supplies a liquid. When the wafer moves in the −X direction indicated by an arrow shown in FIG. 6, the liquid supply nozzle 5B supplies this liquid. Also, when the wafer moves in the +Y direction indicated by an arrow, a liquid supply nozzle 5$c$ supplies the liquid. When the wafer moves in the −Y direction indicated by an arrow, a liquid supply nozzle 5$d$ supplies the liquid.

Since most of the liquid is recovered by the liquid recovery nozzles arranged downstream in the moving direction of the wafer, only the downstream recovery nozzles may be made to operate. However, simultaneous operation of all four of the liquid recovery nozzles 6$a$ to 6$d$ at least while they are supplying the liquid in preparation for unexpected events, such as malfunctioning, can more reliably prevent splashes or spills of the liquid. Instead of providing a plurality of liquid recovery nozzles, one liquid recovery nozzle may be provided around the sides of the final surface 4$s$ so as to surround the sides. The flow rate of the liquid to be supplied from the liquid recovery nozzles 6$a$ to 6$d$ is preferably determined in accordance with equation (3). With the above-mentioned arrangement, the moving direction of the wafer is not limited to the X or Y direction, and even if the wafer moves diagonally, the liquid film can be maintained.

As described above, a plurality of liquid supply nozzles are so arranged as to surround the final surface 4$s$, and one or more liquid supply nozzles for use in supply are switched between the liquid supply nozzles such that ones arranged upstream in the moving direction (the opposite side of the moving direction as seen from the projection optical system) supply the liquid in wafer movement. With this operation, the gap between the final surface 4s and the wafer 9 can always be supplied with the liquid regardless of the moving direction of the wafer. As a result, the gap between the wafer 9 and the final surface 4s can be filled with the liquid without breaking the liquid film not only during scanning exposure, but also during stepping within the surface of the wafer or in changing the moving direction of the wafer. This makes it possible to, in one wafer, fill the gap between the final surface 4s and the wafer 9 with the liquid without breaking the liquid film from the start of the exposure to when exposure of the entire wafer is completed. Consequently, the need for forming a liquid film for every shot is eliminated, and the productivity of the exposure apparatus greatly increases.

Figure 7:
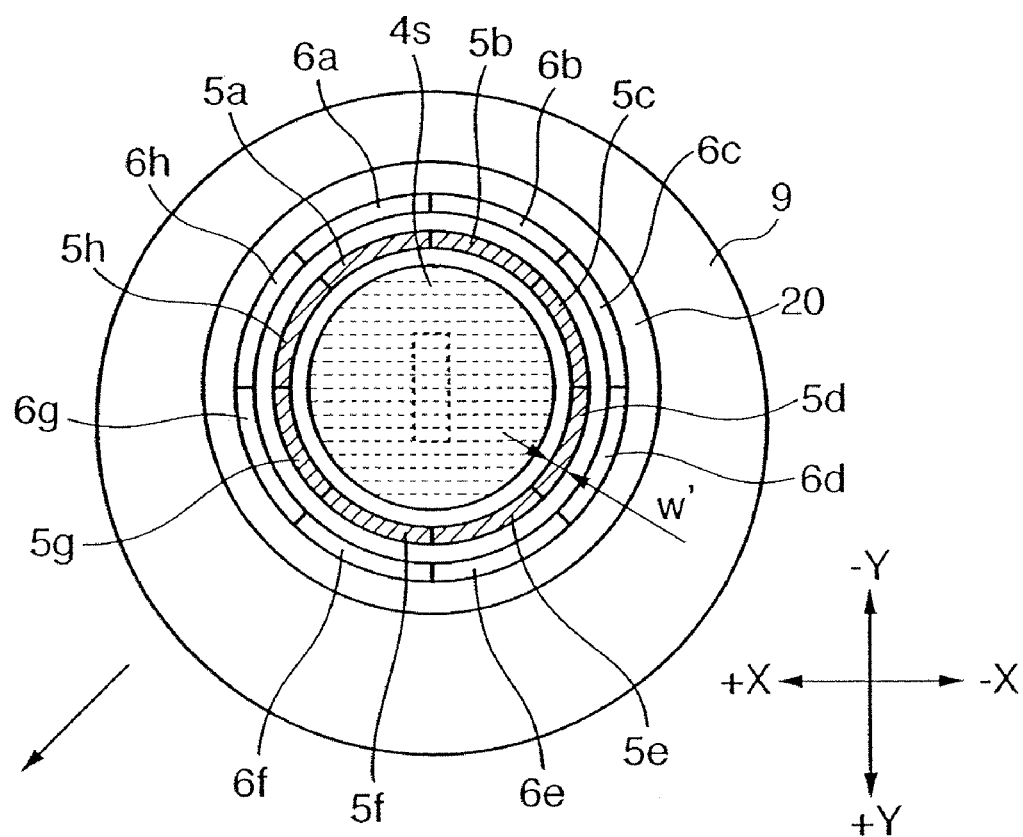
FIG. 7 is a view showing the fifth arrangement example of the liquid supply nozzle and liquid recovery nozzle in the exposure apparatus according to the preferred embodiment of the present invention.

FIG. 7 is a view showing the fifth arrangement example of the structures and layout of the liquid supply nozzles and liquid recovery nozzles. In this arrangement example, the liquid supply nozzles 5a to 5d and liquid supply nozzles 5e to 5h, and the liquid recovery nozzles 6a to 6d and liquid recovery nozzles 6e to 6h are so arranged on circumferences so as to surround the perimeter of the final surface 4s. The liquid supply nozzles are arranged inside the liquid recovery nozzles. The nozzles on the circumferences make it possible to fill the gap between the final surface 4s and the wafer with the liquid by supplying the liquid from one arranged almost upstream in the moving direction and recovering the liquid by at least one arranged downstream of the moving direction, even when the wafer stage 10 moves diagonally.

For example, when the wafer moves at an angle of 45° from the +X and +Y directions, as indicated by an arrow shown in FIG. 7, the nozzles are preferably controlled such that at least the liquid supply nozzles 5b and 5c supply the liquid, while at least the liquid recovery nozzles 6f and 6g recover the liquid. The layout of the nozzles on the circumferences makes it possible to more flexibly form a corresponding liquid film in various moving directions of the wafer. FIG. 7 shows the plurality of divided liquid recovery nozzles. However, simultaneous operation of all the liquid recovery nozzles 6a to 6h at least while they are supplying the liquid in preparation for unexpected events, such as malfunctioning, can more reliably prevent splashes or spills of the liquid, as described in the fourth arrangement example. Instead of providing a plurality of liquid recovery nozzles, only one liquid recovery nozzle may be provided around the perimeter of the final surface 4s so as to surround the perimeter.

When the gap between the wafer and the final surface 4s is not filled with the liquid or when there is still gas in the gap due to incomplete filling with the liquid, the liquid is preferably supplied from upstream in the moving direction of the wafer, as has been described above. On the other hand, after the gap between the wafer 9 and the final surface 4s is completely filled with the liquid, all liquid supply nozzles may supply the liquid regardless of the moving direction of the wafer. In this case, the flow rate of the liquid to be supplied and that of the liquid to be recovered increase, and the running cost increases. On the other hand, supply nozzle switching need not be performed frequently, and the time required for switching is saved, thereby increasing the productivity of the exposure apparatus. Also, the need for a driving unit, which switches between the supply nozzles, is eliminated, and the size of each liquid supply unit can be reduced. Control of liquid supply is not limited to the arrangement example shown in FIG. 7 and can be applied to the nozzle arrangements shown in FIGS. 5 and 6. In this case, as well, the same effect can be obtained.

In the arrangement example shown in FIG. 7, the flow rate of the liquid supplied from the liquid supply nozzles may be determined by applying equation (3) to each liquid supply nozzle. For the sake of simplicity, the liquid can be supplied uniformly from all the liquid supply nozzles at the same flow rate. In the arrangement example shown in FIG. 7, since the discharge ports of the liquid supply nozzles are arranged concentrically about the exposure light beams, the width of the liquid supply port is set to have a constant value w' regardless of the moving direction of the wafer. A total flow rate V' is preferably determined in accordance with equation (4):

$$V' \geqq \pi \cdot D \cdot d \cdot v \tag{4}$$

where π is the circular constant, D is the average diameter of the discharge ports, d is an interval between the wafer and the final surface, and v is the moving velocity of the wafer.

Figure 8:
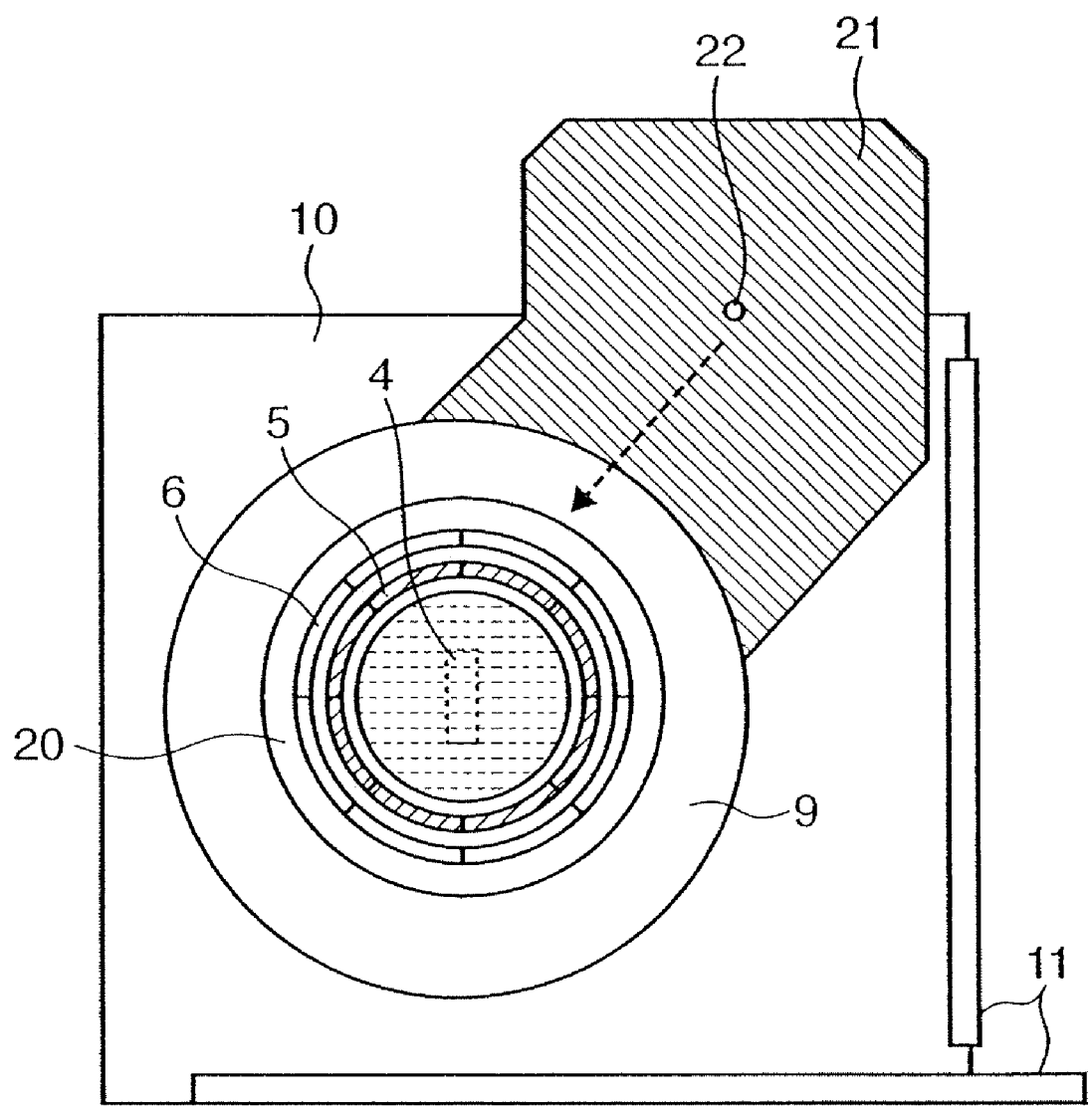
FIG. 8 is a view schematically showing part of the arrangement of another preferred embodiment of the present invention.

Another preferred embodiment of the present invention will be described with reference to FIGS. 8 and 9A to 9D. FIG. 8 is a plan view of a wafer stage 10 as seen from above the nozzles arranged on a projection optical system final surface 4s and its surroundings. The discharge ports of a liquid supply nozzle 5 and liquid recovery nozzle 6 are so arranged as to oppose a wafer 9, and they should be drawn by hidden lines (broken lines) in this plan view as seen from above, according to proper drawings. For the sake of illustrative simplicity, the discharge ports are drawn using solid lines.

A flat plate 21 is provided adjacent to the wafer 9 chuck on the wafer stage 10. The flat plate 21 is so arranged as to be flush with the upper surface of the wafer 9, which is fixed on the wafer stage 10 by vacuum chucking, or the like. A wafer transport apparatus (not shown) is provided to recover/mount the wafer 9 from/onto the wafer stage 10 when the flat plate 21 is located immediately below the final surface 4s.

The steps in this embodiment will be described with reference to FIGS. 9A to 9D. FIGS. 9A to 9D show operation of the units in order of the steps, using the cross-sectional view of the main part of FIG. 8.

Figure 9A:
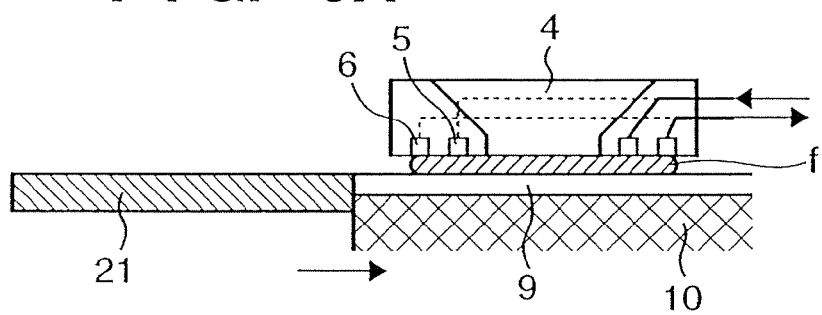
FIGS. 9A to 9D are sectional views showing steps of feeding a flat plate below a projection optical system in an exposure apparatus according to the embodiment shown in FIG. 8.
Figure 9B:
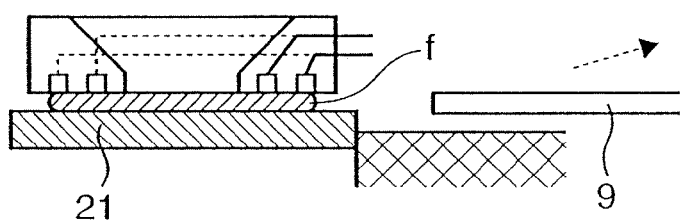
Figure 9C:
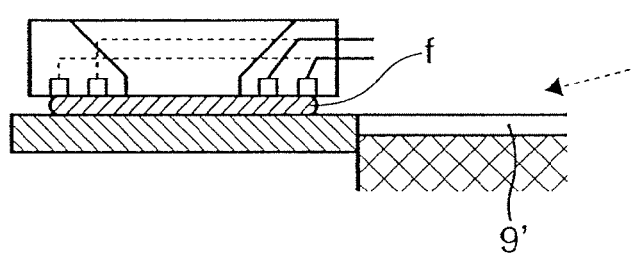

During exposure, a liquid is supplied from the liquid supply nozzle 5 as needed and is recovered by the liquid recovery nozzle 6. In the meantime, the gap between the wafer 9 and the final surface 4s is kept in a state in which the gap is always filled with the liquid (FIG. 9A). After an exposure sequence for one wafer 9 ends, the wafer stage 10 is moved such that the flat plate 21, which is adjacent to the wafer 9, is located immediately below the final surface 4s (FIG. 9B). In moving the wafer stage 10, the liquid supply nozzle 5 continuously supplies the liquid while the liquid recovery nozzle 6 continuously recovers the liquid. With this operation, even when the flat plate 21 is located below the final surface 4s, a space below the final surface 4s is always filled with the liquid. While keeping this state, the exposed wafer 9, which is chucked and fixed on the wafer stage 10, is recovered from the wafer stage 10 to a wafer storage unit (not shown). In addition, a new wafer 9' is mounted on the wafer stage 10 and is chucked and fixed on the wafer stage 10 (FIG. 9C).

Figure 9D:
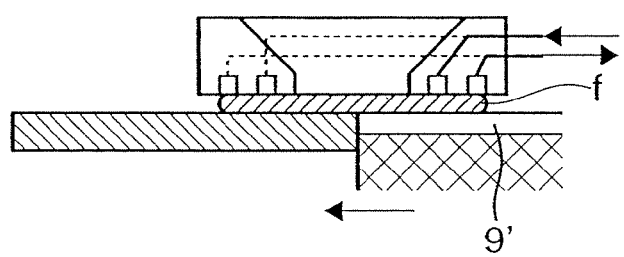

The wafer stage 10 is moved while the liquid supply nozzle 5 continuously supplies the liquid, and the liquid recovery nozzle 6 continuously recovers the liquid. The wafer 9' is fed to immediately below the final surface 4s while filling the space below the final surface 4s with the liquid (FIG. 9D).

This movement of the flat plate 21 to an exposure position while continuously supplying and recovering the liquid even after the exposure makes it possible to recover most of the liquid on the wafer. Accordingly, wafer replacement can smoothly be performed without any special liquid recovery operation, and the productivity of exposure apparatuses can be increased. Since the final surface 4s is always filled with the liquid regardless of whether the wafer replacement is being performed, no impurity contained in the ambient atmosphere directly comes into contact with the final surface 4s. Additionally, the contact area between the liquid and the air is minimized, and thus, the amount of impurities to be absorbed in the liquid can be minimized. Thus, any cloud due to the impurities can be suppressed in the final surface 4s.

When the liquid is recovered every time wafer replacement is performed, a thin liquid film is temporarily attached to the surface of the final surface 4s. If the liquid is pure water, or the like, inorganic components or hydrophilic organic components contained in the environment are likely to be absorbed in the film of pure water. After the pure water evaporates, the inorganic components or organic components are highly likely to remain on the surface of the projection optical system, thereby causing a cloud.

As shown in FIGS. 9B and 9C, during replacement of wafers on the wafer stage 10, a liquid film is maintained between the final surface 4s and the flat plate 21. Immediately before this state, the liquid film had come into contact with the surface of a photosensitive agent applied to the wafer and had received exposure light. When the photosensitive agent is exposed, components contained in the photosensitive agent are released in any event as gas-like substances, and these gas-like substances may be dissolved in the liquid film, which is in contact with the upper surface of the photosensitive agent.

Immediately after the exposure, the gas-like substances are dissolved in the liquid film, and the liquid film is contaminated. The liquid film is preferably replaced with a new one before the start of the next exposure. Otherwise, the dissolved impurities change the transmittance of the liquid film and adversely affect exposure amount control. Degradation in productivity of exposure apparatuses, such as variations in line width, may occur. Furthermore, the dissolved impurities may be supersaturated and may appear as air bubbles, thereby causing poor imaging. The impurities dissolved in the liquid film cause a chemical reaction by exposure light, and may cause clouds in the final surface. Under the circumstances, these problems and solutions to them will be considered.

While the liquid supply nozzle 5 continuously supplies a new liquid, and the liquid recovery nozzle 6 continuously recovers the liquid, the liquid film will be replaced with the new liquid even when the replacement rate is low. Accordingly, in some cases, only supply and recovery by the nozzles 5 and 6 may increase the purity of the liquid film to a level sufficient enough for the next exposure on the wafer 9 or flat plate 21. If the flow rate of the supply or recovery is increased immediately after exposure and is returned to the original flow rate immediately before exposure, the purity of the liquid film can further be increased. In this case, if the wafer 9 and flat plate 21 are moved along with a change in flow rate, and the moving velocities of the wafer 9 and flat plate 21 are changed along with the change in flow rate, the replacement rate of the liquid rate increases. Supplying and recovering the liquid while reciprocating or rotating the wafer 9 or flat plate 21 is more preferable because liquid films can be replaced continuously.

While the liquid supply nozzle 5 continuously supplies a new liquid, and the liquid recovery nozzle 6 continuously recovers the liquid, the liquid film will be replaced with new liquid even when the replacement rate is low. Accordingly, in some cases, only supply and recovery by the nozzles 5 and 6 may increase the purity of the liquid film to a level sufficient enough for the next exposure on the wafer 9 or flat plate 21. If the flow rate of the supply or recovery is increased immediately after exposure and is returned to the original flow rate immediately before exposure, the purity of the liquid film can further be increased. In this case, if the wafer 9 and flat plate 21 are moved along with a change in flow rate, and the moving velocities of the wafer 9 and flat plate 21 are changed along with the change in flow rate, the replacement rate of the liquid rate increases. Supplying and recovering the liquid while reciprocating or rotating the wafer 9 or flat plate 21 is more preferable because liquid films can be replaced continuously.

This increase or decrease in supply flow rate and recovery flow rate may be performed for every shot region or every wafer. The interval between executions or timings of execution may be changed as needed. Even if the exposure process is not performed, outgassing can occur depending on the material for the photosensitive agent to be used. In some cases, just contact of a liquid film with the photosensitive agent can cause contamination to develop. In other cases, outgassing may occur in a large amount with respect to the necessary exposure amount. Hence, a liquid film may be contaminated more than expected.

Under the circumstances, as another method of more actively replacing a liquid film below the final surface of the projection system with a new liquid, a suction port 22 may be provided at an appropriate position such as the center of the flat plate 21, as shown in FIGS. 10A to 10D. Suction units (not shown), such as a suction pump and cylinder, are connected to the suction port 22 to suck a gas or liquid. More specifically, as shown in FIGS. 10A to 10D, a liquid is recovered from the suction port 22 while the flat plate 21 is fed below the final surface 4s. At the same time, the flow rate to be supplied from the liquid supply nozzle 5 is increased by at least the same amount as the flow rate to be sucked from the suction port 22. With this operation, most of the liquid film below the final surface 4s flows not only externally in the radius direction (toward the liquid recovery nozzle 6), but toward the suction port 22 at the center. Even when the flat plate 21 is in a stationary state, the liquid film can always continuously be replaced with a new liquid (FIGS. 10B and 10C).

With the above-mentioned arrangement, the replacement rate of the liquid below the final surface 4s drastically increases. Liquid replacement is performed not only on a photosensitive agent susceptible to contamination, but on the flat plate 21, which can employ a material that is resistant to chemical contamination and can maintain the cleanliness with ease. For this reason, a gap below the final surface 4s can be filled with a liquid of high purity. Thus, influences, such as a cloud of impurities in the outer air or impurity gas components generated from the surface of the photosensitive agent onto the final surface 4s, can effectively be suppressed.

Liquid film replacement, as shown in FIGS. 9A to 9D and 10A to 10D, is not limited to wafer replacement. The liquid film replacement can be performed as needed, even during an exposure sequence of one wafer regularly or irregularly.

In the arrangement example shown in FIGS. 9A to 9D and 10A to 10D, the flat plate 21 is arranged on the wafer stage. When a wafer is transferred between the wafer stage and a wafer transport apparatus (not shown), the flat plate 21 is located immediately below the final surface 4s. However, the flat plate 21 may be arranged to be located immediately below the final surface 4s even when various operations necessary before and after exposure or various operations necessary for maintaining and managing the exposure apparatus, such as an alignment measurement step with an off-axis microscope (not shown), before exposure. If a plurality of flat plates 21 or a plurality of suction ports 22 need to be arranged at a plurality of wafer stage positions immediately below the final surface 4s, the plurality of flat plates or a plurality of suction ports may be arranged on the wafer stage. Like the flush plate 19 shown in FIG. 3, the flat play may be arranged so as to surround the wafer. Alternatively, a plurality of suction ports may be provided in the flat plate at the positions, each of which opposes the final surface during a respective one of the various operations.

In FIGS. 9A to 9D and 10A to 10D, the flat plate 21 is arranged on the wafer stage 10. A dedicated driving unit (not shown) may be provided such that the flat plate 21 can move independently of the wafer stage 10. In this case, the flat plate 21 should be driven so as not to form a large gap between the flat plate 21 and the wafer 9, which is chucked and fixed on the wafer stage 10. For example, when shifting from the state in FIG. 9A to that in FIG. 9B or when shifting from the state in FIG. 9C to that in FIG. 9D, the wafer stage 10 and flat plate 21 should be so driven as to move near the final surface 4s while keeping a positional relationship to be adjacent to each other. At least while the gap between the wafer and the flat plate 21 passes immediately below the final surface, the flat plate 21 must be kept flush with the upper surface of the wafer.

After a liquid film is moved between the final surface and the flat plate 21, the flat plate 21 maintains the position while the wafer stage 10 arbitrarily changes the position. With this operation, the flat plate 21 and wafer stage 10 can perform various steps. By providing a mechanism which moves the flat plate 21 independently of the wafer stage 10, as described above, a space below the final surface 4s can be filled with a liquid during a period when the wafer stage 10 is used for various operations other than exposure. Also, this mechanism eliminates the need for a plurality of flat plates or suction ports, and thus, the size of the exposure apparatus can be reduced.

A sensor 21s, such as an illuminance uniformity sensor for measuring the illuminance distribution of exposure light or an absolute illumination meter for measuring the absolute illuminance, may be provided at an appropriate position of the flat plate 21. In this case, illuminance uniformity and absolute illuminance can be measured while a space below the final surface 4s is continuously filled with a liquid without temporarily recovering the liquid and in almost the same immersion state as during exposure. As described above, the flat plate preferably moves independently of the wafer stage in view of productivity. In the case of a scanning exposure apparatus, an illuminance uniformity sensor is preferably arranged on the wafer stage together with the flat plate because the cumulative illuminance uniformity during scanning can be measured.

Use of a function of sucking a gas or liquid from the suction port 22 makes it possible to generate an initial liquid film on the final surface 4s more quickly. A method of generating an initial liquid film using the suction port 22 will be described with reference to FIGS. 11A to 11D.

First, the flat plate 21 is moved such that the suction port 22 is located immediately below almost the center of the liquid supply nozzle 5, which is so arranged as to surround the perimeter of the final surface 4s. In this state, a liquid is supplied onto the flat plate 21 from the entire perimeter of the liquid supply nozzle 5 (FIG. 11A).

The supplied liquid forms an annular liquid film f in accordance with the location of the liquid supply nozzle 5 between parallel planes (contiguous members) 20, including the final surface 4s and the flat plate 21, while a gas g remains at the center. If the liquid is merely continuously supplied in this manner, the gas g is trapped by the liquid film f, and the gas g is not discharged outside. Accordingly, the space below the final surface 4s cannot completely be filled with the liquid indefinitely.

Under the circumstances, the gas g is sucked through the suction port 22 while the liquid is annually supplied from the liquid supply nozzle 5 to the space below the final surface 4s. This suction makes the pressure of the gas g more negative than the pressure of the outer environment. The difference in pressure causes a force to act on the liquid film formed around the perimeter of the gas g from the perimeter to the suction port 22, and the liquid film starts spreading quickly toward the suction port 22 (FIG. 11B). The suction through the suction port 22 is continued. When the liquid starts to be sucked through the suction port 22, the gap between the final surface 4s and flat plate 21 is filled with a liquid film without the gas g (FIG. 11C).

The suction from the suction port 22 is stopped. While the suction is stopped, supply of a liquid from the liquid supply nozzle 5 may be stopped when the wafer stage 10 is stopped. However, when the liquid is in a stationary state, a gas constituting the environment or an impurity is always absorbed in the liquid. Then, the number of air bubbles or the concentration of an impurity increases, and trouble may occur. More specifically, air bubbles may not disappear and may remain until exposure, micro-bubbles may be generated by exposure, or the final surface may be clouded by the absorbed impurity. To prevent such trouble, it is preferable to continuously supply a liquid even while the wafer stage 10 is kept stopped and to recover the liquid by at least the liquid recovery nozzle 6 while the liquid is kept supplied.

During a period from that shown in FIG. 11A to that in FIG. 11C, the liquid recovery nozzle 6 may be stopped. To prevent the liquid from externally splashing due to vibrations, a sudden change in liquid supply amount, or the like, the liquid recovery nozzle 6 is preferably always operated.

Finally, the wafer stage 10 is moved such that the wafer 9 is located immediately below the final surface 4s while continuously supplying and recovering the liquid (FIG. 11D).

As described above, if an annular liquid film grows toward the center, a liquid film free from air bubbles can be formed more quickly, and the productivity of the exposure apparatus can be increased. This method does not require movement of the stage. This method is suitable as a method of generating a large-area liquid film when a projection optical system with a larger numerical aperture is adopted.

With the suction port 22, the liquid film can be recovered quickly. More specifically, when the liquid film is transferred between the final surface 4s and the flat plate 21, supply of the liquid from the liquid supply nozzle 5 is stopped, and the liquid is recovered from the suction port 22. With this operation, most of the liquid film between the final surface 4s and flat plate 21 can quickly be recovered. At this time, to more completely recover the liquid, the liquid may be sucked while moving the wafer stage 10. With the recovery function of the liquid film, the liquid film can be recovered immediately. For this reason, maintenance and inspection operation of the apparatus, and a remedy operation against failure can quickly be performed without any delay.

Figure 12A:
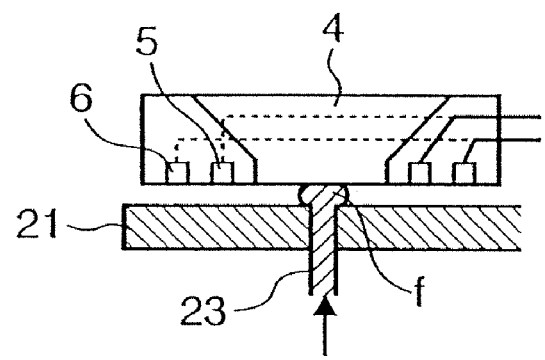
FIGS. 12A to 12C are sectional views showing another step of generating a liquid film below the projection optical system in the exposure apparatus according to the embodiment shown in FIG. 8.
Figure 12B:
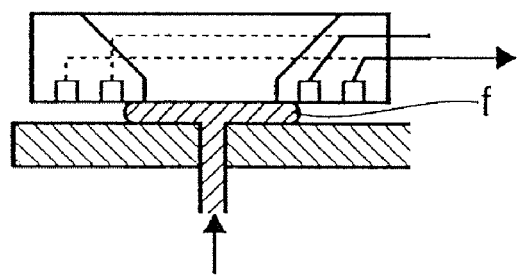
Figure 12C:
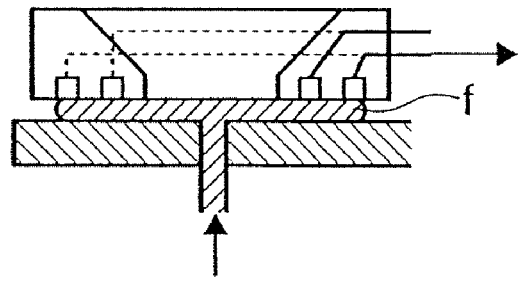

The method of quickly generating an initial liquid film using the suction port 22 formed in the flat plate 21 has been described with reference to FIGS. 11A to 11D. Aside from this method, even when a liquid inlet port 23 is provided in the flat plate 21 instead of the suction port 22, and a liquid is supplied from a liquid supply unit (not shown) through the liquid inlet port 23, as shown in FIGS. 12A to 12C, the initial liquid film can quickly be generated to be described later. More specifically, in FIGS. 12A to 12D, the flat plate 21 is moved such that the liquid inlet port 23 is located immediately below almost the center of the liquid supply nozzle 5, which is arranged so as to surround the perimeter of the final surface 4s. In this state, the liquid is supplied onto the flat plate 21 through the liquid inlet port 23. The supplied liquid forms a small liquid film between the final surface 4s and the flat plate 21, including the liquid inlet port 23 (FIG. 12A).

When the liquid is further supplied through the liquid inlet port 23, the small liquid film f spreads radially (FIG. 12B), and the gap between the final surface 4s and the flat plate 21 is supplied with the liquid.

The liquid is recovered as needed through the liquid recovery nozzle 6. This prevents the liquid from leaking from the flat plate 21 or final surface 4s (FIG. 12C).

Use of the liquid inlet port 23 also makes it possible to continuously fill the liquid film below the final surface 4s without externally splashing or leaking the liquid while the flat plate 21 is in a stationary state, as described with reference to FIGS. 10A to 10D. More specifically, the liquid is supplied from the liquid inlet port 23, and at the same time, the liquid is recovered through the liquid recovery nozzle 6. At this time, supply of the liquid from the liquid supply nozzle 5 is preferably stopped.

With this operation, the space between the flat plate 21 and the final surface 4s starts to be filled with a liquid from almost the center. This can make the contact area with the ambient gas smaller than a method of filling the liquid from the perimeter of the final surface 4s using the suction port 22. A gas dissolved in the initial liquid film or an impurity contained in the gas can be reduced. For this reason, more stable exposure/resolving performance can be obtained, and the effect of suppressing a cloud caused by an impurity can further be increased.

The suction port 22 shown in FIGS. 10A to 10D and 11A to 11D may be provided in the flat plate 21, in addition to the liquid inlet port 23. The liquid inlet port 23 may be used to generate an initial liquid film or perform liquid film replacement while the suction port 22 may be used to recover the liquid for replacing the liquid film portion with the ambient gas. A single opening portion can implement both of the functions of the liquid inlet port 23 and those of the suction port 22. More specifically, a suction unit (not shown) and liquid supply unit (not shown) may communicate with an opening formed in the flat plate 21 through a switching valve, and the switching valve may be switched, thereby switching between the functions of the suction port 22 and those of the liquid inlet port 23 as needed. This can reduce the size of the flat plate 21.

Use of the flat plate 21, suction port 22, and liquid inlet port 23, described with reference to FIGS. 8 to 12C, is not limited to a combination with the liquid supply nozzle or liquid recovery nozzle described explicitly in this specification. For example, the flat plate 21, suction port 22, and liquid inlet port 23 can be used in combination with various liquid supply and recovery mechanisms, such as a liquid supply pipe and liquid recovery pipe disclosed in WO99/49504.

Figure 13:
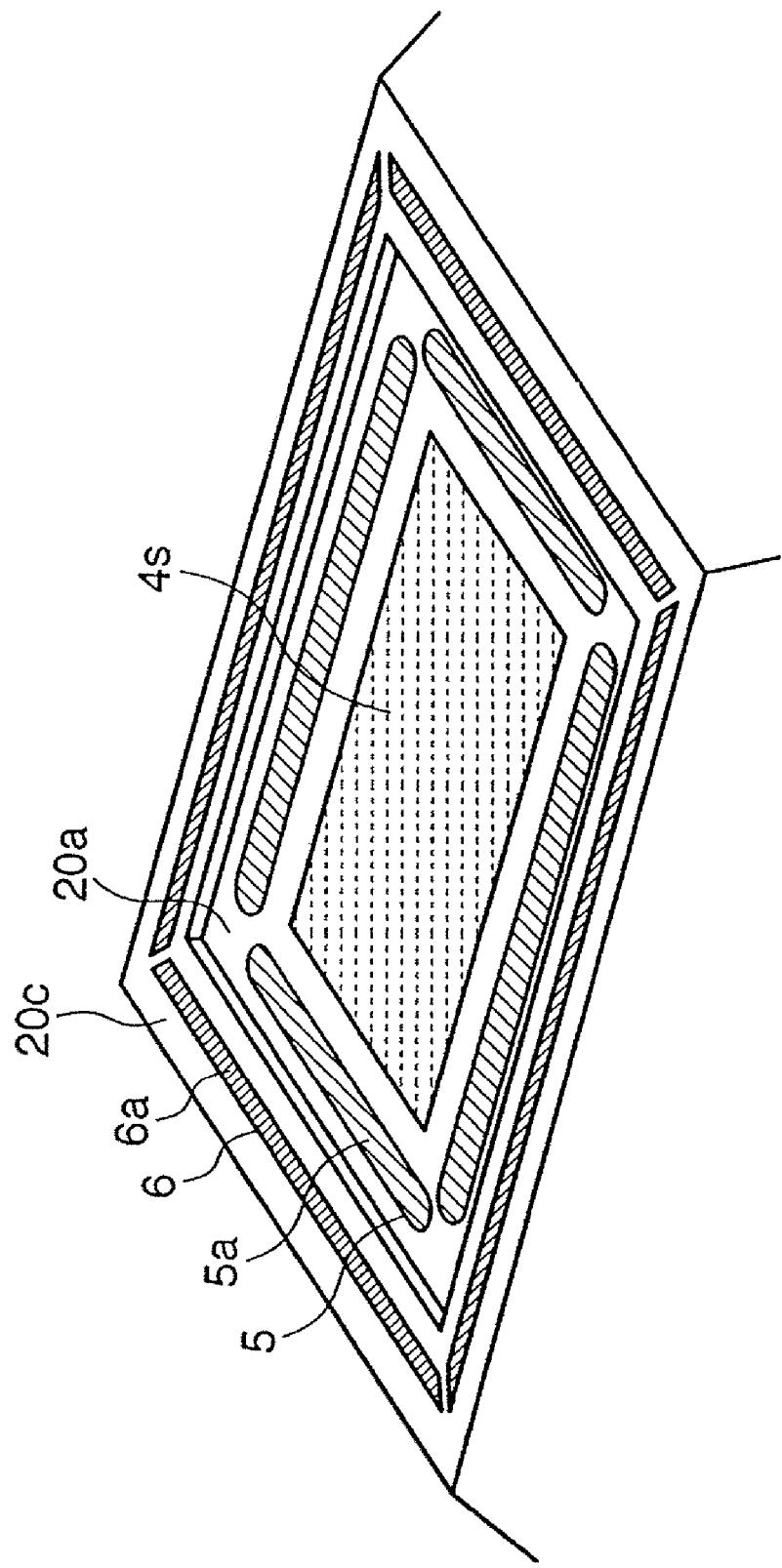
FIG. 13 is a view showing the sixth arrangement example of the liquid supply nozzle and liquid recovery nozzle in the exposure apparatus according to the embodiment shown in FIG. 8.

FIG. 13 is a perspective view showing the sixth arrangement of the structures and layout of a liquid supply nozzle and liquid recovery nozzle. The arrangement example shown in FIG. 13 is different from the arrangement example shown in FIG. 6 in that a peripheral portion (projection portion) 20c is provided outside the perimeter of a liquid contact surface 20a on which the liquid supply nozzles 5 are arranged and nearer to the wafer than the liquid contact surface 20a, i.e., there is a step. The liquid recovery nozzles 6 are arranged annularly on the peripheral portion 20c.

Since the peripheral portion 20c is arranged outside the perimeter of the liquid contact surface 20a on which a liquid film of the final surface 4s is formed and nearer to the wafer than the liquid contact surface 20a, a liquid is unlikely to escape outside the liquid contact surface 20a. This can reduce the ability to recover a liquid through the liquid recovery nozzles 6 and can reduce the sizes of the liquid recovery nozzles 6 and a liquid recovery unit 8. In the arrangement example shown in FIG. 13, each liquid recovery nozzle 6 is arranged on the peripheral portion 20c. However, the liquid recovery nozzles may be arranged on, e.g., the liquid contact surface 20a or may be arranged on both of the liquid contact surface 20a and peripheral portion 20c to more reliably recover the liquid.

In the arrangement shown in FIG. 13, the peripheral portion 20c, which is raised from the liquid contact surface 20a inside the peripheral portion 20c, surrounds the perimeter of the final surface 4s. For example, if the moving direction of the wafer is limited, the peripheral portion 20c or stepped portion may be arranged only on the downstream side of the moving direction of the wafer. In this case, the length of the peripheral portion 20c or stepped portion is desirably equal to or larger than that of the liquid recovery nozzle 6.

Each of the ports of the liquid supply nozzles 5 and liquid recovery nozzles 6 may be arranged as a mere opening. However, to reduce nonuniformity of the liquid supply amount or recovery amount and prevent liquid dripping, a porous plate or porous member with fine pores is preferably provided to each port. A porous member formed by sintering a fibrous or particulate metal material or inorganic material is particularly preferable. As a material for the porous plate or member (a material used for at least the surface), stainless, nickel, alumina, and quartz glass are preferable in view of affinity for pure water, or a fluorinated solution used as an immersion medium.

Figure 14:
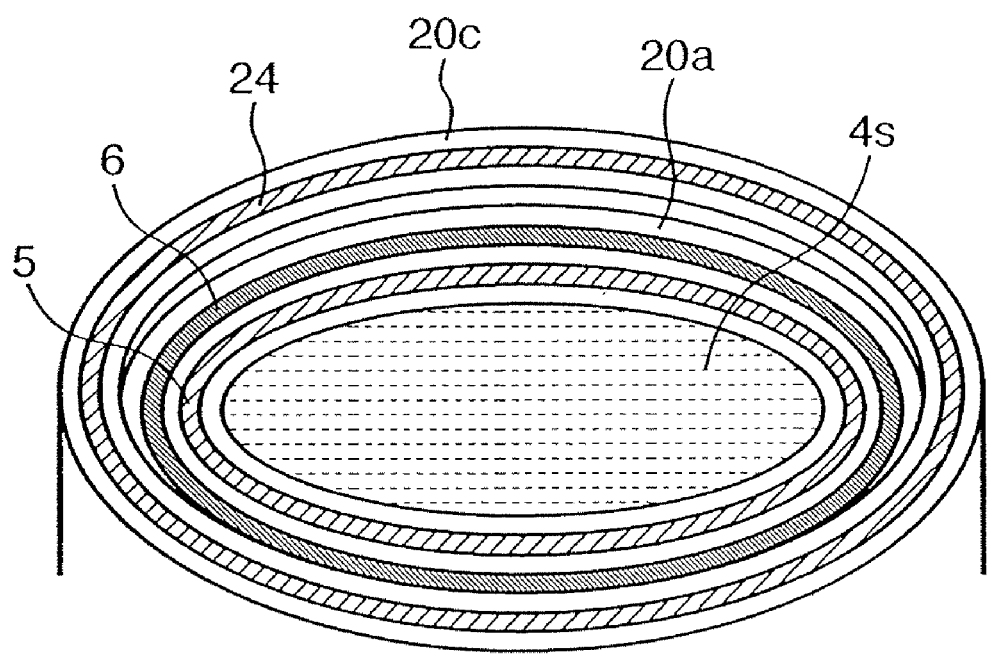
FIG. 14 is a view showing the seventh arrangement example of the liquid supply nozzle and liquid recovery nozzle in the exposure apparatus according to the embodiment shown in FIG. 8.

FIG. 14 is a perspective view of the seventh arrangement example of the structures and layout of the liquid supply nozzle and liquid recovery nozzle. The arrangement example shown in FIG. 14 is different from the first to sixth arrangement examples in that an inert gas outlet portion 24 is provided at the outermost portion, which surrounds the final surface 4s.

The inert gas outlet portion (outlet ring) 24 communicates with an inert gas supply unit (not shown) and is arranged to eject an inert gas toward the wafer or flat plate arranged below at almost a constant rate. While a liquid film is formed between the final surface 4s and the wafer or flat plate, an inert gas is ejected from the inert gas outlet portion 24. By applying a pressure to the liquid film with the inert gas from the perimeter side, a liquid constituting the liquid film can be prevented from externally splashing. This functions effectively, particularly when the wafer or flat plate moves. The supply of the inert gas presses the liquid film toward the center, and thus, the liquid film can be prevented from attaching to the surface of the wafer or the flat plate and remaining on it. The supply of the inert gas can also dry the surface of the wafer or flat plate. If the inert gas is used only to dry the wafer or flat plate, the pressure of the inert gas may be low.

To suppress nonuniformity in the ejecting rate between locations, a porous plate or porous member may be provided to the outlet port of the inert gas outlet portion 24, like the liquid supply nozzle 5. If the inert gas outlet portion 24 comprises a slit nozzle, which ejects an inert gas through a fine gap of about 0.1 mm, the consumption amount of the inert gas can be suppressed.

With the above-mentioned arrangement, a liquid can more reliably be prevented from remaining on the upper surface of the wafer or flat plate. This eliminates the need for a unit or operation to recover the remaining liquid and contributes to increasing the productivity of exposure apparatuses and preventing an increase in apparatus size. In addition, supply of an inert gas can reduce a period when the surface of a photosensitive agent applied to the upper surface of the wafer is kept wet and can immediately dry the surface of the photosensitive agent. The dependence on the wet stage, which influences a development step after exposure of the photosensitive agent, can be minimized. Thus, the photosensitive agent can be expected to have stable resolving performance.

In the arrangement example shown in FIG. 14, the liquid supply nozzle 5 and liquid recovery nozzle 6 are arranged on the liquid contact surface 20a, which is almost flush with the final surface 4s. The peripheral portion 20c is arranged outside the liquid supply nozzle 5 and liquid recovery nozzle 6 nearer to the wafer than the liquid contact surface 20a, and the inert gas outlet portion 24 is arranged on the peripheral portion 20c. The inert gas outlet portion nearer to the wafer than the liquid contact surface 20a makes it possible to obtain a large pressure difference with a relatively small gas flow rate, suppress the running cost of the exposure apparatus, and minimize influences of the inert gas on the outside. The effect of the inert gas outlet portion can be obtained even if the inert gas outlet portion 24 is arranged within the liquid contact surface 20a. In the arrangement examples shown in FIGS. 3 to 5, an inert gas outlet portion, whose length is equal to or larger than that of the liquid supply nozzle 5 or liquid recovery nozzle 6, can be provided outside the liquid supply nozzle 5 and liquid recovery nozzle 6 and upstream in the moving direction of the wafer.

Assume that a gas suction portion (suction ring) (not shown) is provided around the perimeter of the inert gas outlet portion 24 to suck and recover an inert gas ejected from the inert gas outlet portion 24 and discharge the sucked inert gas to a place which does not influence the surroundings of the exposure region. In this case, influences of the inert gas on the surroundings of the exposure region can be minimized. A typical example of the influences of the inert gas on the surroundings of the exposure region will be described. For example, the inert gas flows into the optical path of an interferometer, which measures the position of a wafer stage, or the optical path of an optical focus sensor, so that components of the gas in the optical path become nonuniform in view of time or space. This causes fluctuating measurement values and results in a measuring error.

As the inert gas, air or nitrogen from which moisture or an impurity, such as an organic substance, acidic gas, or alkaline gas, that may cause clouds in an optical system or may influence a photosensitive agent is sufficiently removed, is appropriately used. Particularly, use of nitrogen can prevent oxygen in the outer air from dissolving in the liquid with which the space below the final surface is filled. This use can prevent the contact surface with the liquid from being oxidized and corroded when pure water or functional water is employed as the liquid.

Figure 15:
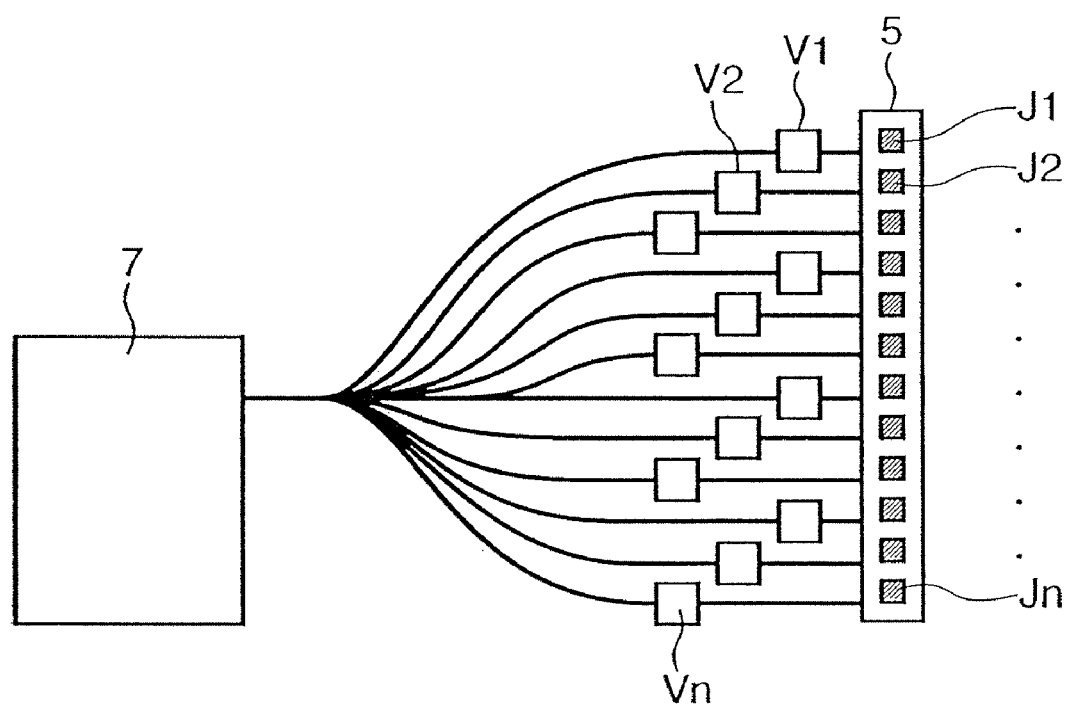
FIG. 15 is a view showing an arrangement example of a nozzle unit (nozzle unit comprising a plurality of nozzles) in the exposure apparatus according to the embodiment shown in FIG. 8.

FIG. 15 is a view showing a preferred arrangement example of the liquid supply nozzle 5. The outlet port of each of the liquid supply nozzles 5 shown in FIGS. 3 to 8, 13 and 14 has a slit-like shape. On the other hand, in the arrangement example shown in FIG. 15, one nozzle unit (discharge unit) 5 has n (a plurality of) nozzles J1 to Jn. These nozzles J1 to Jn are connected to the liquid supply unit 7 through on-off valves V1 to Vn, respectively. By switching the operation of each of the valves V1 to Vn corresponding to the nozzles J1 to Jn, supply of a liquid can be started/stopped separately.

Such nozzles may be arranged not only in one line, but in a plurality of lines. In this case, the supply flow rate can be increased, and a liquid film can be formed to have a complicated shape.

Figure 16:
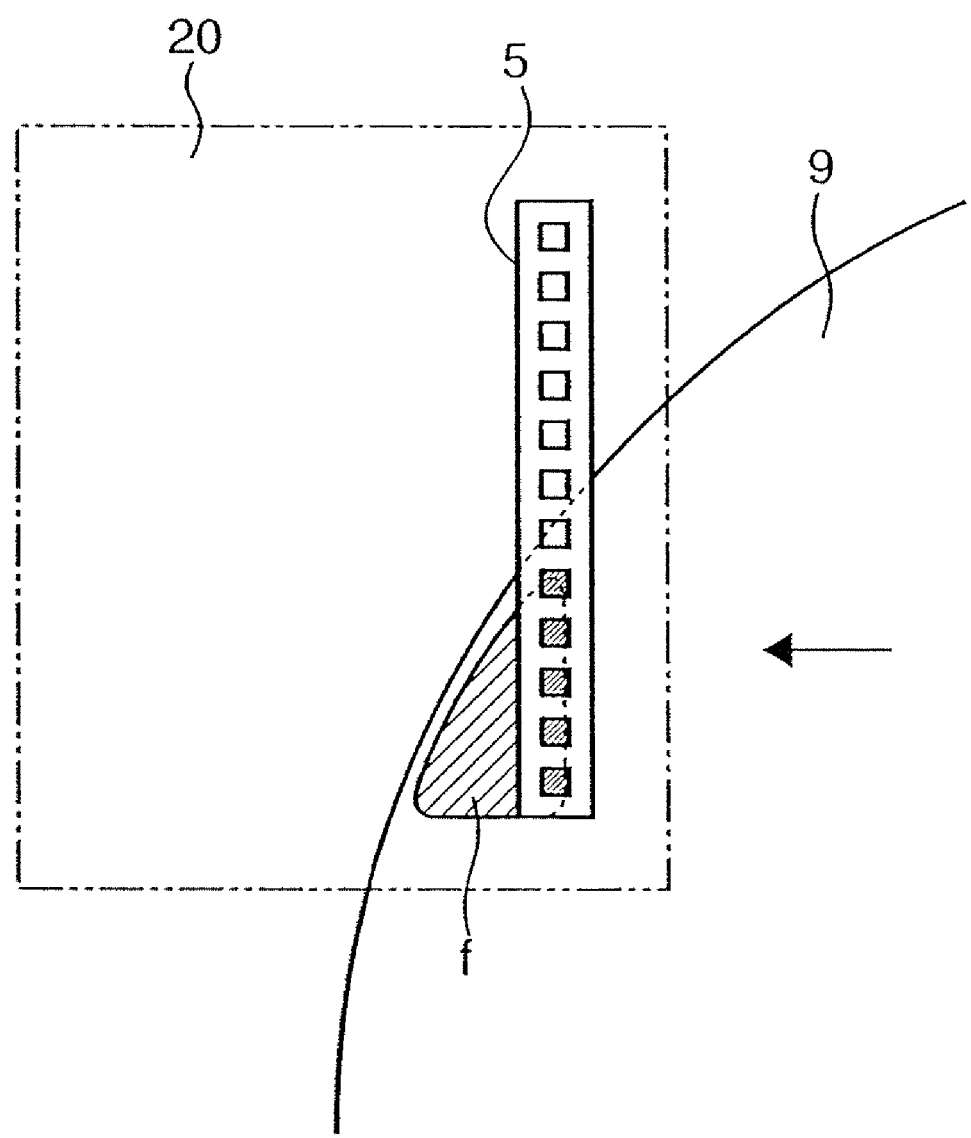
FIG. 16 is a view showing an application of the nozzle unit shown in FIG. 15.

The nozzle unit 5, comprising a plurality of nozzles, can be controlled in the following manner. When immersion is to be performed from the peripheral border of the wafer, as shown in FIG. 16, only the on-off valves corresponding to one of the plurality of nozzles under which the wafer is positioned are opened to supply the liquid. As the wafer moves, the on-off valves corresponding to one of the plurality of nozzles under which the wafer comes are sequentially opened to further supply the liquid onto the wafer. This can prevent the liquid from leaking from the wafer. This reduces the unit load for recovering the liquid.

FIG. 16 shows a case wherein the wafer moves and enters a region below the line of nozzles. The same applies to a case wherein the wafer comes off the region below the line of nozzles. Alternatively, a flush plate may be provided outside the wafer. In this case, supply of the liquid from each nozzle only needs to be controlled in accordance with the edge of the flush plate. This can minimize the size of the flush plate. As a result, the moving distance of the wafer can be reduced, and the size of the apparatus can be reduced.

In the arrangement example shown in FIG. 15, supply/stop of the liquid from each unit of the nozzle units 5 is controlled by opening/closing the corresponding on-off valve. Alternatively, a function of discharging/stopping droplets can be embedded in each nozzle of the nozzle unit, as in, e.g., an inkjet printer. In addition to a continuous supply of the liquid, a substantially continuous liquid film can be formed by discharging droplets at a high frequency. More specifically, the structures and functions of, e.g., a bubble jet nozzle, thermal jet nozzle, or piezo-jet nozzle can be used.

According to the preferred embodiment of the present invention, in a projection exposure apparatus using immersion, a liquid film can be generated between a final surface and a substrate in a short period of time without splashing droplets. Also, generation of micro-bubbles during projection exposure can be suppressed. In addition, the need for operation of separately recovering the liquid for each substrate, for each alignment step before exposure, or for each step of maintaining the performance of the exposure apparatus, is eliminated. The projection optical system final surface can be coated with a liquid always having high purity, and the contact area with the ambient atmosphere can be reduced. Accordingly, a predetermined exposure and resolving performance can stably be obtained, and clouds due to an impurity contained in the environment or photosensitive agent can be suppressed or prevented. This allows high-precision and stable projection exposure without increasing the scale of an exposure apparatus and decreasing the productivity of the exposure apparatus. A fine pattern can be transferred onto a substrate stably and satisfactorily.

Figure 17:
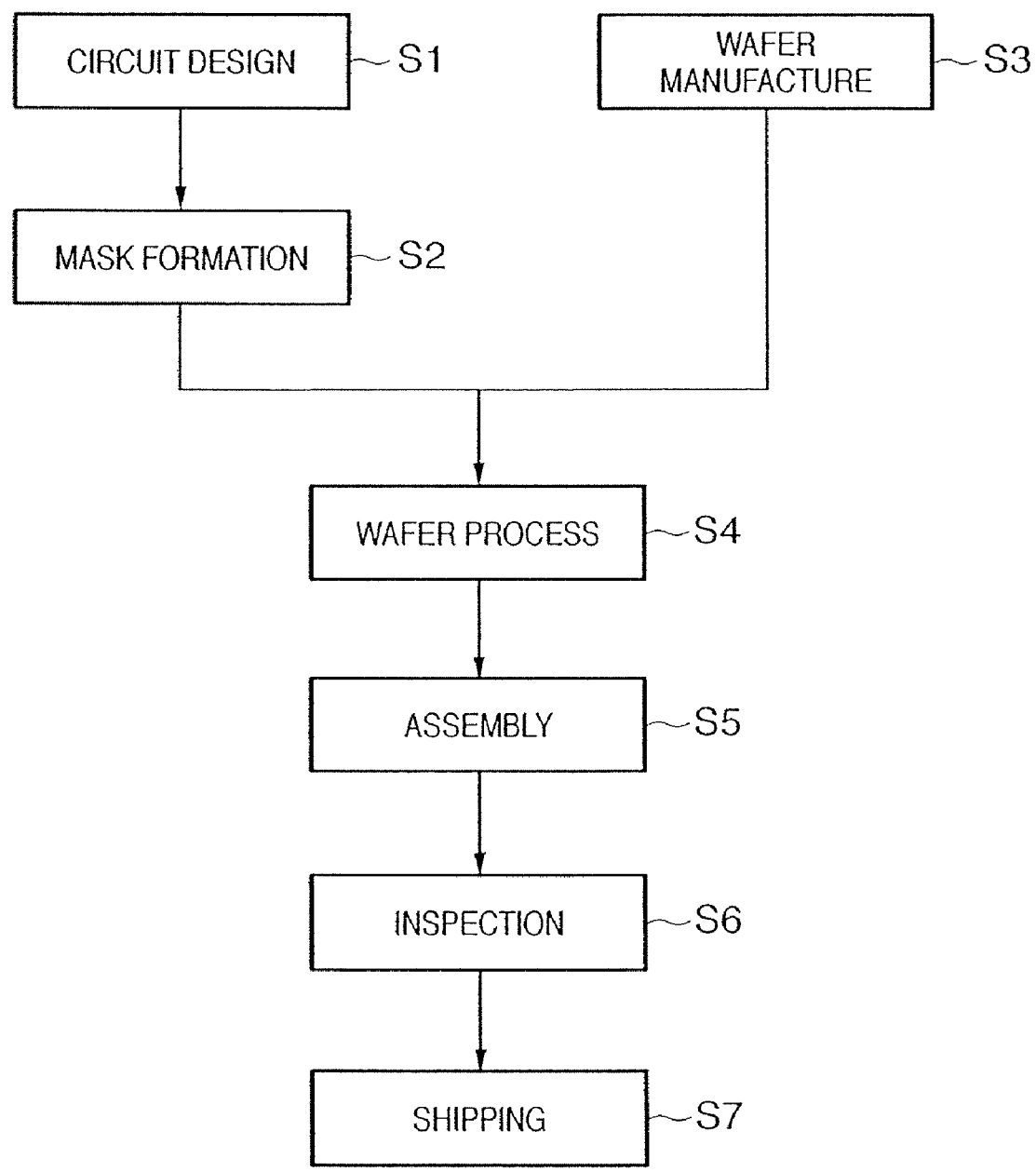
FIG. 17 is a flowchart showing the whole manufacturing process of a semiconductor device.

The manufacturing process of a semiconductor device using the above-mentioned exposure apparatuses will be described next. FIG. 17 shows the flow of the whole manufacturing process of the semiconductor device. In step 1 (circuit design), a semiconductor device circuit is designed. In step 2 (mask formation), a mask having the designed circuit pattern is formed.

In step 3 (wafer manufacture), a wafer is manufactured by using a material such as silicon. In step 4 (wafer process), called a preprocess, an actual circuit is formed on the wafer with the above-mentioned exposure apparatus by lithography using the prepared mask and wafer. Step 5 (assembly), called a post-process, is the step of forming a semiconductor chip by using the wafer formed in step 5, and includes an assembly process (dicing and bonding) and a packaging process (chip encapsulation). In step 6 (inspection), the semiconductor device manufactured in step 5 undergoes inspections such as an operation confirmation test and a durability test of the semiconductor device manufactured in step 5. After these steps, the semiconductor device is completed and shipped (step 7).

The wafer process in step 4 comprises the following steps. More specifically, the wafer process includes an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of transferring the circuit pattern onto the wafer having undergone the resist processing step using the above-mentioned exposure apparatus, a development step of developing the wafer exposed in the exposure step, an etching step of etching a portion except for the resist image developed in the development step, and a resist removal step of removing an unnecessary resist after etching. These steps are repeated to form multiple circuit patterns on the wafer.

The present invention can increase the practicality of an exposure technique using immersion and, more specifically, more reliably fill the gap between the final surface of a projection optical system and a substrate with a liquid, suppress contamination on the final surface of the projection optical system, simplify the structure of an exposure apparatus and reduce the size of the exposure apparatus, or the like.

As many apparently widely different embodiments of the present invention can be made without departing form the spirit and scope thereof, it is to be understood that the invention is not limited to the specific embodiments thereof except as defined in the appended claims.

What is claimed is:

1. An exposure apparatus having a projection optical system configured to project a pattern of an original onto a substrate and exposing the substrate to light with a gap between the substrate and a final surface of the projection optical system being filled with liquid, the apparatus comprising:
    a supply unit having a supply port and configured to supply the liquid to the gap through the supply port;
    a recovery unit having a recovery port outside the supply port and configured to recover the liquid from the gap through the recovery port;
    an ejection unit having an ejection port and configured to eject a gas through the ejection port outside the liquid filled in the gap; and
    a suction unit having a suction port and configured to suck the gas through the suction port outside the liquid filled in the gap,
    wherein the suction port is arranged outside the ejection port.

2. An apparatus according to claim 1, wherein the supply port is arranged to entirely surround the final surface, the ejection port is arranged outside the recovery port and the suction port is arranged outside the recovery port.

3. An apparatus according to claim 2, wherein the supply port includes a plurality of supply ports arranged to entirely surround the final surface.

4. An apparatus according to claim 1, wherein the gas is an inert gas.

5. An apparatus according to claim 1, wherein a porous plate or a porous member is arranged at the ejection port.

6. An apparatus according to claim 1, wherein a shape of the ejection port is a slit.

7. An apparatus according to claim 1, wherein the ejection port and the suction port are arranged to surround the final surface.

8. An apparatus according to claim 1, wherein the recovery port is arranged inside the ejection port.

9. An apparatus according to claim 1, further comprising an opposing member having an opposing surface opposing a surface of the substrate, wherein the supply port and the recovery port are arranged in the opposing surface, and the ejection port is arranged nearer to the surface of the substrate than to the opposing surface.

10. An apparatus according to claim 1, the apparatus further comprising an opposing member having an opposing surface opposing a surface of the substrate, wherein the supply port, the recovery port and the ejection port are arranged in the opposing surface.

11. An apparatus according to claim 10, further comprising:
    an original stage configured to hold the original and to be moved; and
    a substrate stage configured to hold the substrate and to be moved,
    wherein the apparatus exposes the substrate to light via a pattern of the original while scanning the original and the substrate in regard to the projection optical system.

12. A method of manufacturing a device, the method comprising:
    exposing a substrate to light using an exposure apparatus according to claim 1;
    developing the exposed substrate; and
    processing the developed substrate to manufacture the device.

13. An exposure apparatus having a projection optical system configured to project a pattern of an original onto a substrate and exposing the substrate to light with a gap between the substrate and a final surface of the projection optical system being filled with liquid, the apparatus comprising:
    a supply unit having a supply port and configured to supply the liquid to the gap through the supply port, the supply port being arranged to entirely surround the final surface;
    a recovery unit having a recovery port and configured to recover the liquid from the gap through the recovery port;
    an ejection unit having an ejection port and configured to eject a gas through the ejection port outside the liquid filled in the gap; and
    a suction unit having a suction port and configured to suck the gas through the suction port outside the liquid filled in the gap,
    wherein the suction port is arranged outside the ejection port.

14. An apparatus according to claim 13, wherein the supply port includes a plurality of supply ports arranged to entirely surround the final surface.

15. A method of manufacturing a device, the method comprising:
    exposing a substrate to light using an exposure apparatus according to claim 13;
    developing the exposed substrate; and
    processing the developed substrate to manufacture the device.

* * * * *